United States Patent
Ueno

(10) Patent No.: US 9,196,284 B2
(45) Date of Patent: Nov. 24, 2015

(54) IN-LINE TYPE FILM FORMING APPARATUS AND METHOD FOR MANUFACTURING MAGNETIC RECORDING MEDIUM

(75) Inventor: Satoru Ueno, Chiba (JP)

(73) Assignee: SHOWA DENKO K.K., Tokyo (JP)

(*) Notice: Subject to any disclaimer, the term of this patent is extended or adjusted under 35 U.S.C. 154(b) by 861 days.

(21) Appl. No.: 13/510,546

(22) PCT Filed: Nov. 15, 2010

(86) PCT No.: PCT/JP2010/070276
§ 371 (c)(1),
(2), (4) Date: May 17, 2012

(87) PCT Pub. No.: WO2011/062134
PCT Pub. Date: May 26, 2011

(65) Prior Publication Data
US 2012/0231158 A1    Sep. 13, 2012

(30) Foreign Application Priority Data

Nov. 19, 2009   (JP) .................................. 2009-263856

(51) Int. Cl.
*G11B 5/85* (2006.01)
*C23C 14/50* (2006.01)
(Continued)

(52) U.S. Cl.
CPC . *G11B 5/85* (2013.01); *C23C 14/50* (2013.01); *C23C 14/568* (2013.01);
(Continued)

(58) Field of Classification Search
CPC ................. H01L 21/67069; H01L 21/67748; H01L 21/67751; H01L 21/67017; C23C 16/54; C23C 16/4412; C23C 14/568; C23C 16/4401
USPC ................. 118/719, 718; 156/345.31–345.32
See application file for complete search history.

(56) References Cited

U.S. PATENT DOCUMENTS 4,042,128 A * 8/1977 Shrader .......................... 414/287
5,679,165 A * 10/1997 Maeda et al. .................. 118/719
(Continued)

FOREIGN PATENT DOCUMENTS

JP     4-293782 A    10/1992
JP     04-323370 A   11/1992
(Continued)

OTHER PUBLICATIONS

Office Action with a mailing dated of Dec. 3, 2013 for corresponding Japanese Application No. 2009-263856.
(Continued)

*Primary Examiner* — Rudy Zervigon
(74) *Attorney, Agent, or Firm* — Sughrue Mion, PLLC

(57) ABSTRACT

There is provided an in-line type film-forming apparatus that can prevent a substrate from being dropped out of a carrier and convey the carrier at high speed. A first supporting member (41) is supported to be displaceable in a direction along an attaching face (S1) of the support base (40) in accordance with the growth of the first supporting member (41) due to thermal expansion in a horizontal direction, a second supporting member (42) is supported to be displaceable in a direction negating the growth of the first supporting member (41) due to thermal expansion in the horizontal direction along an attaching face (S2) of the first supporting member (42) in accordance with the growth of the second supporting member (42) due to thermal expansion in the horizontal direction, and a holder (3) is supported to be displaceable in a direction negating the growth of the first and second supporting members (41) and (42) due to thermal expansion in the vertical direction along an attaching face (S3) of the third supporting member (43) in accordance with the growth of the holder (3) due to thermal expansion in the vertical direction.

11 Claims, 11 Drawing Sheets

(51) Int. Cl.
*C23C 14/56* (2006.01)
*H01L 21/67* (2006.01)
*H01L 21/677* (2006.01)
*C23C 16/54* (2006.01)
*C23C 16/44* (2006.01)

(52) U.S. Cl.
CPC ........ *C23C 16/4401* (2013.01); *C23C 16/4412* (2013.01); *C23C 16/54* (2013.01); *H01L 21/67017* (2013.01); *H01L 21/67069* (2013.01); *H01L 21/67748* (2013.01); *H01L 21/67751* (2013.01)

(56) References Cited

U.S. PATENT DOCUMENTS

| | | | |
|---|---|---|---|
| 6,430,468 B1* | 8/2002 | Tepman et al. | 700/218 |
| 6,572,934 B2* | 6/2003 | Watanabe et al. | 427/534 |
| 2004/0035360 A1* | 2/2004 | Yamazaki et al. | 118/715 |
| 2004/0040504 A1* | 3/2004 | Yamazaki et al. | 118/715 |
| 2004/0139914 A1* | 7/2004 | Yamazaki et al. | 118/719 |
| 2005/0214102 A1* | 9/2005 | Juergensen et al. | 414/217 |
| 2006/0112881 A1 | 6/2006 | Kaeppeler | |
| 2010/0150687 A1* | 6/2010 | Sakata et al. | 414/222.07 |
| 2010/0222919 A1* | 9/2010 | Kazuyuki et al. | 700/228 |
| 2011/0190927 A1* | 8/2011 | Douki | 700/228 |
| 2011/0287177 A1* | 11/2011 | Yamada et al. | 427/127 |
| 2012/0231158 A1* | 9/2012 | Ueno | 427/128 |

FOREIGN PATENT DOCUMENTS

| | | |
|---|---|---|
| JP | 04-337069 A | 11/1992 |
| JP | 08-274142 A | 10/1996 |
| JP | 10-081967 A | 3/1998 |
| JP | 2002-288888 A | 10/2002 |
| JP | 2007-501329 A | 1/2007 |
| JP | 2008-130638 A | 6/2008 |

OTHER PUBLICATIONS

Office Action with a mailing date of May 22, 2013 for corresponding Singapore Application No. 201203722-2.

* cited by examiner

IN-LINE TYPE FILM FORMING APPARATUS AND METHOD FOR MANUFACTURING MAGNETIC RECORDING MEDIUM

TECHNICAL FIELD

The present invention relates to an in-line type film-forming apparatus that performs processes such as film formation and the like while sequentially conveying a substrate that is a film formation target between a plurality of chambers and a method for manufacturing a magnetic recording medium using such an in-line type film-forming apparatus.

Priority is claimed on Japanese Patent Application No. 2009-263856, filed on Nov. 19, 2009, the content of which is incorporated herein by reference.

BACKGROUND ART

Recently, the application range of magnetic recording devices such as magnetic disk devices, flexible disk devices, and magnetic tape devices has been markedly increased, the importance of the magnetic recording devices has increased, and the recording density of a magnetic recording medium used in such devices has shown a corresponding marked improvement. Particularly, since the introduction of MR heads, PRML techniques, and the like, the surface recording density of an HDD (hard disk drive) has been intensively increased, and recently, a GMR head, a TuMR head, and the like have been introduced, and accordingly, the surface recording density continues to increase at the pace of about 1.5 times per year.

Meanwhile, as a magnetic recording type of an HDD, recently, a so-called vertical magnetic recording type has come into widespread use as a technique replacing the conventional in-plane magnetic recording type (a recording type in which the magnetization direction is parallel to the substrate face). In such a vertical magnetic recording type, crystal particles included in a recording layer, in which information is recorded, have an axis of easy magnetization in a direction vertical to the substrate. The axis of easy magnetization represents a direction in which the magnetization is easily oriented, and, in the case of a Co alloy that is generally used, is an axis (c axis) that is parallel to the normal line of plane (0001) of the hcp structure of Co. According to the vertical magnetic recording type, since the axis of easy magnetization of magnetic crystal particles is in the vertical direction, there are characteristics such that, even when the implementation of a high recording density progresses, the effect of the diamagnetic field is small between recording bits, and static-magnetic stability is achieved.

For the vertical magnetic recording medium, generally, film formation is performed in the order of a base layer, an intermediate layer (alignment control layer), a recording magnetic layer, and a protection layer on a nonmagnetic substrate. In addition, there are many cases in which after film formation up to the protection layer is performed, a lubricating film is formed, with which the surface is coated. Furthermore, in many cases, a magnetic layer called a soft magnetic backing layer is disposed under the base layer. The base layer and the intermediate layer are formed for the purpose of further improving the characteristics of the recording magnetic layer. More specifically, the base layer and the intermediate layer have a function of controlling the form of the magnetic crystals while at the same time arranging the crystal alignment of the recording magnetic layer.

The above-described magnetic recording medium is configured by laminating a plurality of thin films that are formed mainly by using a sputtering method. Accordingly, the magnetic recording medium, generally, is manufactured using an in-line type film-forming apparatus in which a plurality of chambers (processing devices) forming thin films configuring the magnetic recording medium is connected in one row through a gate valve. Here, each chamber is configured to include a reaction vessel including a pair of electrodes, a gas-introducing tube that introduces gas into the inside of the reaction vessel, a vacuum pump that discharges gas placed inside the reaction vessel, and the like. In such an in-line type film-forming apparatus, a substrate as a processing target is sequentially conveyed to the inside of each chamber, and a predetermined thin film is formed inside each chamber. Accordingly, in the in-line type film-forming apparatus, by passing the substrate in one cycle, thin films corresponding to the number of chambers can be formed on the substrate (for example, see Patent Document 1).

However, as an example of the problem that occurs most frequently when a magnetic recording medium is manufactured using such an in-line type film-forming apparatus, there is the dropping of a processing target substrate from a carrier that holds the processing target substrate inside the reaction vessel. More specifically, in the in-line type film-forming apparatus, processes such as film formation and the like are performed for a processing target substrate while a holder that maintains the processing target substrate sequentially conveys an installed carrier between a plurality of chambers, and there is a case where the processing target substrate falls from the carrier in the middle of the conveying process so as to stop the device.

More specifically, a carrier used in a conventional in-line type film-forming apparatus, for example, as illustrated in FIG. 13, has a structure in which holders 301 are installed to the upper portion of a support base 300. The holder 301 includes a hole portion 302 that arranges the processing target substrate W' on the inner side thereof and a plurality of supporting arms 303 that are disposed so as to be elastically transformable on the periphery of the hole portion 302 and can hold the substrate W' inserted into the inside of each supporting arm 303 to be detachably attached while the outer peripheral portion of the processing target substrate W' is brought into contact with the plurality of supporting arms 303.

Here, when the magnetic recording medium is manufactured, the temperature of the carrier slowly rises due to an electric discharge or heating occurring inside the chamber and is finally 250° C. or more. At this time, a supporting position between the supporting arm 303 and the processing target substrate W' in the above-described holder 301 is displaced by about 1 mm due to thermal expansion of the carrier. In the in-line type film-forming apparatus, in a case where such a displacement occurs, there is a case where the processing target substrate W' is dropped out of the holder 301 when the substrate W' is detached from the holder 301 by a robot.

Accordingly, in a conventional in-line type film-forming apparatus, although the handling position is adjusted by estimating the deformation due to such thermal expansion, the deviation at the handling position needs to be suppressed to about 0.1 mm, whereby an operator's skill is necessary. In other words, it is necessary for an operator to perform positional adjustment while the above-described displacement is predicted, and monitoring needs to be continued while an increase in the temperature of the carrier is waited for even after the positional adjustment.

In addition, in manufacturing the magnetic recording medium using the in-line type film-forming apparatus, in order to increase the production capacity, it is demanded that the carrier be light-weight, and the conveying speed of the carrier be increased.

In the in-line type film-forming apparatus, in a case where the above-described trouble of the dropping of the substrate from the carrier occurs, first, the reaction vessel is open after the inside of the reaction vessel is formed to be in the state of atmospheric pressure, after the fallen substrate is taken out from reaction vessel, the inside of the reaction vessel is decompressed again, and then the device is restarted. Here, while the operation of removing the substrate from the reaction vessel is completed in several minutes, a time of several hours is needed until the device is restarted thereafter by decompressing the reaction vessel, and accordingly, there is a problem in that the productivity of the magnetic recording medium decreases. Particularly, since higher crystallinity is required for thin films configuring the magnetic recording medium, it is necessary to set base pressure (the degree of vacuum reaching the maximum) as a higher-vacuum side and to perform film formation in an environment in which the amount of impurity is small. Accordingly, a time required for decompressing the reaction vessel essentially increases.

PATENT DOCUMENT

[Patent Document 1] Japanese Patent Application Publication No. 8-274142

SUMMARY OF INVENTION

The present invention has been proposed in consideration of such general situations, and the object is to provide an in-line type film-forming apparatus that prevents the dropping of a substrate from a carrier and can further improve the production efficiency by conveying the carrier at high speed and a method for manufacturing a magnetic recording medium using such an in-line type film-forming apparatus.

The present invention provides the following means.
(1) There is provided an in-line type film-forming apparatus including: a plurality of chambers that perform a film-forming process; a carrier in which a holder holding a substrate as a film-forming target inside the plurality of chambers is installed; and a conveying device that sequentially conveys the carrier between the plurality of chambers, the carrier includes a support base, a first supporting member that is installed to the support base, a second supporting member that is installed to the first supporting member, and a third supporting member that is installed to the second supporting member and has a structure in which the holder is installed to the third supporting member, the first supporting member is supported to be displaceable in a direction along an attaching face of the support base in accordance with growth of the first supporting member due to thermal expansion in a horizontal direction, the second supporting member is supported to be displaceable in a direction along an attaching face of the first supporting member in accordance with growth of the second supporting member due to thermal expansion in the horizontal direction, the holder is supported to be displaceable in a direction along an attaching face of the third supporting member in accordance with growth of the holder due to thermal expansion in a vertical direction, and, out of the first supporting member, the second supporting member, the third supporting member, and the holder, any one member is supported to be displaceable in a direction negating growth of the other members in the horizontal direction and/or the vertical direction.

(2) In the in-line type film-forming apparatus described in (1), wherein, in accordance with the growth of the second supporting member due to thermal expansion in the horizontal direction, the second supporting member is supported to be displaceable along an attaching face of the first supporting member in a direction negating the growth of the first supporting member due to thermal expansion in the horizontal direction.
(3) In the in-line type film-forming apparatus described in (1), wherein, in accordance with the growth of the holder due to thermal expansion in the horizontal direction, the holder is supported to be displaceable along an attaching face of the third supporting member in a direction negating the growth of the first and second supporting members due to thermal expansion in the horizontal direction.
(4) In the in-line type film-forming apparatus described in any one of (1) to (3), wherein, in accordance with the growth of the holder due to thermal expansion in the vertical direction, the holder is supported to be displaceable along an attaching face of the third supporting member in a direction negating the growth of the first and second supporting members due to thermal expansion in the vertical direction.
(5) In the in-line type film-forming apparatus described in any one of (1) to (4), a direction along an attaching face of the first supporting member for the support base and a direction along an attaching face of the second supporting member for the first supporting member are the horizontal direction, and a direction along an attaching face of the holder for the third supporting member is the vertical direction or a direction intersecting the horizontal direction.
(6) In the in-line type film-forming apparatus described in any one of (1) to (5), displacement of the second supporting member, which is due to thermal expansion, is larger than that of the first supporting member, and displacement of the holder, which is due to thermal expansion, is larger than that of the second supporting member.
(7) In the in-line type film-forming apparatus described in any one of (1) to (6), the third supporting member is formed from a material having a coefficient of thermal expansion that is smaller than those of the first and second supporting members.
(8) In the in-line type film-forming apparatus described in any one of (1) to (7), the holder includes a hole portion used for arranging the substrate on the inside and a plurality of supporting arms installed to the periphery of the hole portion so as to be elastically transformable and holds the substrate inserted into the inside of the supporting arms so as to be freely detachable or attachable while an outer peripheral portion of the substrate is brought into contact with the plurality of the supporting arms.
(9) In the in-line type film-forming apparatus described in (8), groove portions with which the outer peripheral portion of the substrate is engaged are disposed in tip end portions of the plurality of the supporting arms.
(10) In the in-line type film-forming apparatus described in any one of (1) to (9), the conveying device includes a driving device that drives the carrier in a non-contact manner and a guiding device that guides the carrier driven by the driving device.
(11) There is provided a method of manufacturing a magnetic recording medium, the method including: forming at least a magnetic layer on the surface of the substrate by using the in-line type film-forming apparatus described in any one of (1) to (10).

Advantageous Effects of Invention

As above, according to the present invention, by using an in-line type film-forming apparatus that can convey a carrier at high speed while a substrate is prevented from being dropped out from a carrier, the production efficiency of the magnetic recording medium can be increased.

DESCRIPTION OF EMBODIMENTS

Hereinafter, embodiments of the present invention will be described in detail with reference to the drawings.

In this embodiment, a case will be described as an example in which a magnetic recording medium installed to a hard disk device (magnetic recording and reproducing device) is manufactured by using an in-line type film-forming apparatus according to the present invention.
(Processing Device)

Figure 1:
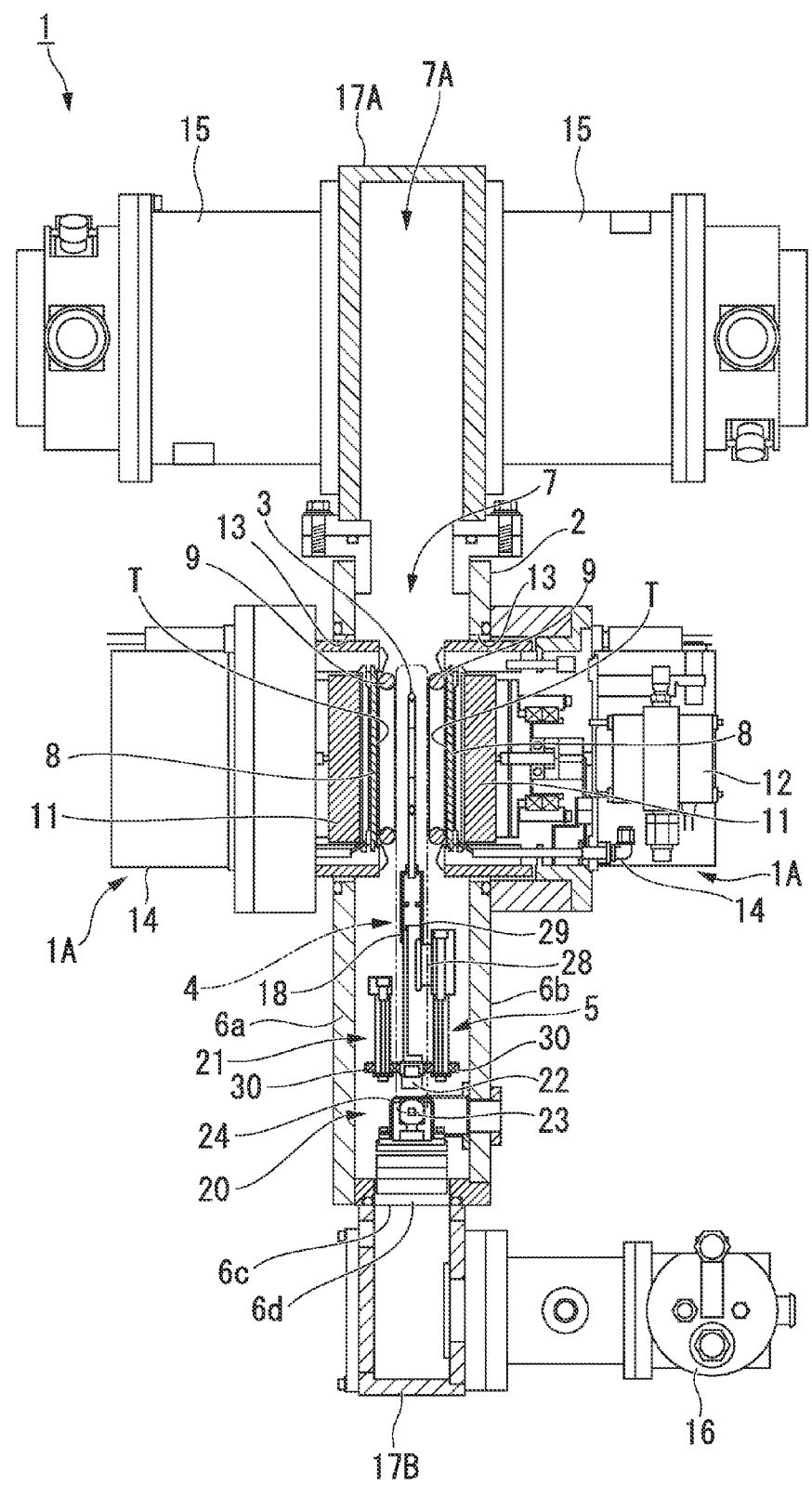
FIG. 1 is a partially notched cross-sectional view illustrating an example of a processing device according to the present invention.

First, an example of a processing device 1, which is illustrated in FIG. 1, included in an in-line type film-forming apparatus according to the present invention will be described.

This processing device 1 configures one processing chamber in the in-line type film-forming apparatus that performs a film-forming process and the like while sequentially conveying a substrate (processing target substrate) W as a film-forming target between a plurality of chambers to be described later.

More specifically, this processing device 1, as illustrated in FIG. 1, includes a reaction vessel 2 in which a processing target substrate W is arranged, and, inside the reaction vessel 2, a carrier 4 to which a holder 3 holding the processing target substrate W is installed and a conveying device 5 that conveys the carrier 4 are arranged.

Figure 2:
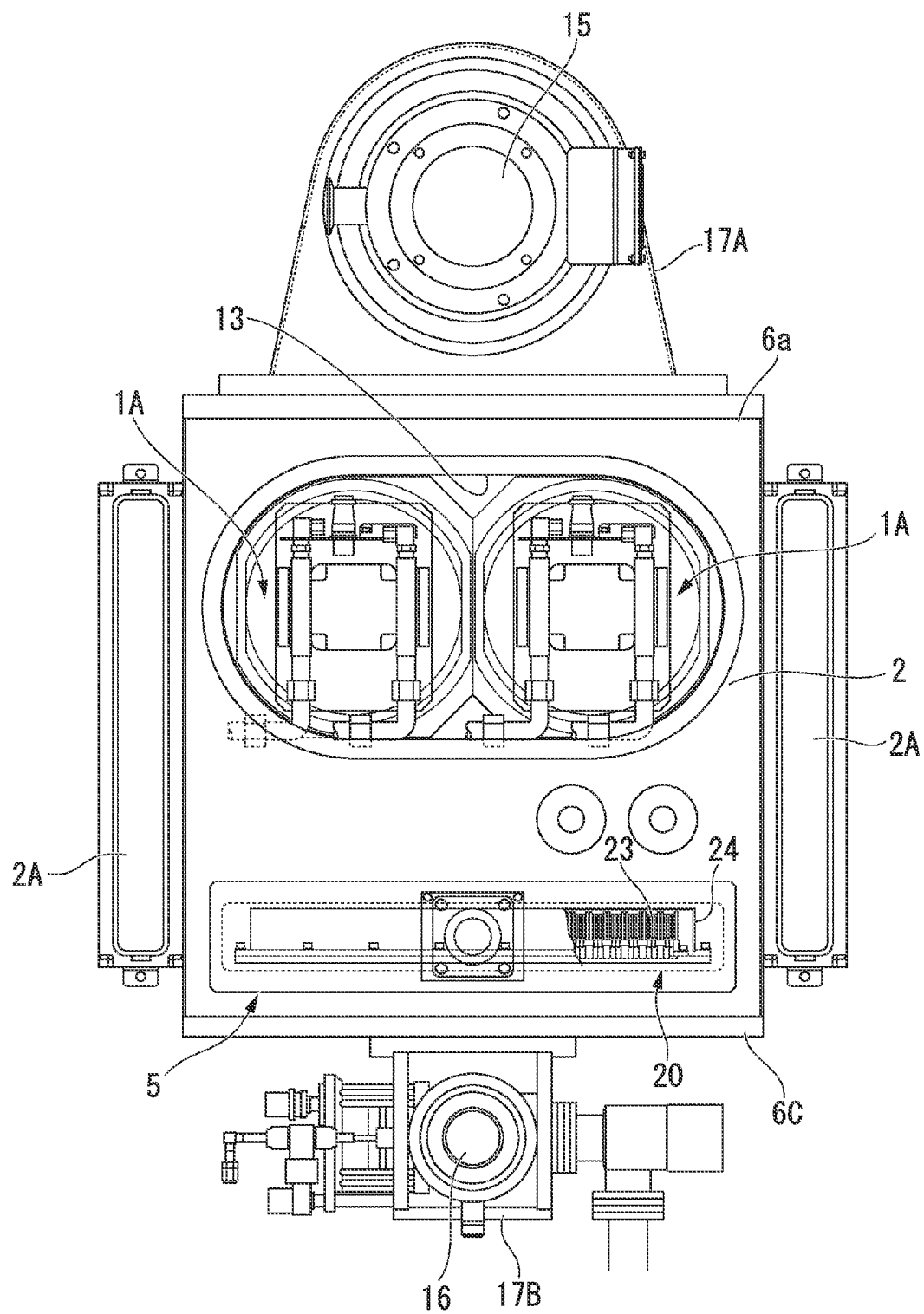
FIG. 2 is a front view of the processing device illustrated in FIG. 1.

The reaction vessel 2, as illustrated in FIGS. 1 and 2, is a vacuum vessel (chamber) that is configured to be airtight by partition walls having pressure resistance so as to form a high vacuum state inside, and an internal space 7 having a flat shape is formed between a front-side partition wall 6a and a rear-side partition wall 6b that face each other. In addition, the carrier 4 that holds the processing target substrate W is arranged in a center portion of the internal space 7, and the conveying device 5 is arranged on the lower side of the carrier 4.

In addition, two holders 3 are installed to the carrier 4 so as to be aligned on a straight line in the conveying direction. In addition, the two holders 3 hold the processing target substrate W so as to be vertically disposed (a state in which the principal face of the processing target substrate W is parallel to the direction of the force of gravity).

Furthermore, in front and behind the reaction vessel 2 in the conveying direction, a substrate carry-out entrance (not illustrated in the figure) that passes the carrier 4 between adjacent reaction vessels (chambers) and a pair of gate valves 2A that open or close the substrate carry-out entrance are disposed. In other words, the reaction vessel 2 is connected to a chamber adjacent thereto through the gate valve 2A.

The processing device 1 includes processing units (processing means) 1A that perform a film-forming process and the like for both faces of the processing target substrate W that is held in the carrier 4 at the front-side partition wall 6a and the rear-side partition wall 6b of the reaction vessel 2.

The processing units 1A are arranged so as to face both faces of two processing target substrates W held by the holder 3. The processing unit 1A, for example, is configured by a cathode unit that is used for causing sputtering discharge in a case where a film-forming process is performed through sputtering, is configured by an electrode unit that is used for forming a film-forming space according to a CVD method in a case where the film-forming process is performed by using the CVD (CDV: Chemical Vapor Deposition) method, and is configured by an ion arm and the like in a case where the film-forming process is performed by using a PVD (Physical Vapor Deposition) method. As above, as examples of the processing unit 1A, there are processing units that are installed to various devices such as a sputtering device (including a magnetron sputtering device, a DC sputtering device, an RF sputtering device, an MW sputtering device, a reactive sputtering device, and the like), a chemical vapor deposition device (CVD device), a physical vapor deposition device (PVD device), an ion-injecting device, a plasma etching device, a substrate-heating device, a reactive plasma-processing device, and a substrate-cooling device.

For example, the processing device 1 according to this embodiment is acquired by applying the present invention to a magnetron sputtering device. In the magnetron sputtering device, a target is arranged so as to face a substrate arranged inside a reaction vessel, and in order to generate a magnetic field near the surface of the target, a magnet is arranged on the rear face of the target, a high voltage of a high frequency (RF) or the like is applied between the substrate and the target in an atmosphere of inert gas, plasma is formed by causing electrons ionized in accordance with the high voltage to collide with the inert gas, and target particles sputtered by positive ions contained in the plasma are deposited on the surface of the substrate, whereby the film-forming process is performed. In addition, generally, the magnet arranged on the rear face of the target is configured by disposing a magnet having a magnetization direction that is a direction vertical to the principal face of the target on the inner side and disposing a magnet having a magnetization direction that is opposite to that of the above-described magnet on the outer side.

More specifically, in order for this processing device 1 to perform a film-forming process and the like simultaneously for both faces of two processing target substrates W, inside the reaction vessel 2, a total of four backing plates 8 are arranged so as to face both faces of the two processing target substrates W held by the carrier 4. Targets T are installed to the faces (front faces) of the four backing plates 8 that face the processing target substrates W. In addition, each backing plate 8 is connected to a high frequency power source (or a microwave power source) that is not illustrated in the figure, and accordingly, a high-frequency voltage can be applied to the target T from the high-frequency power source through the backing plate 8.

Figure 3:
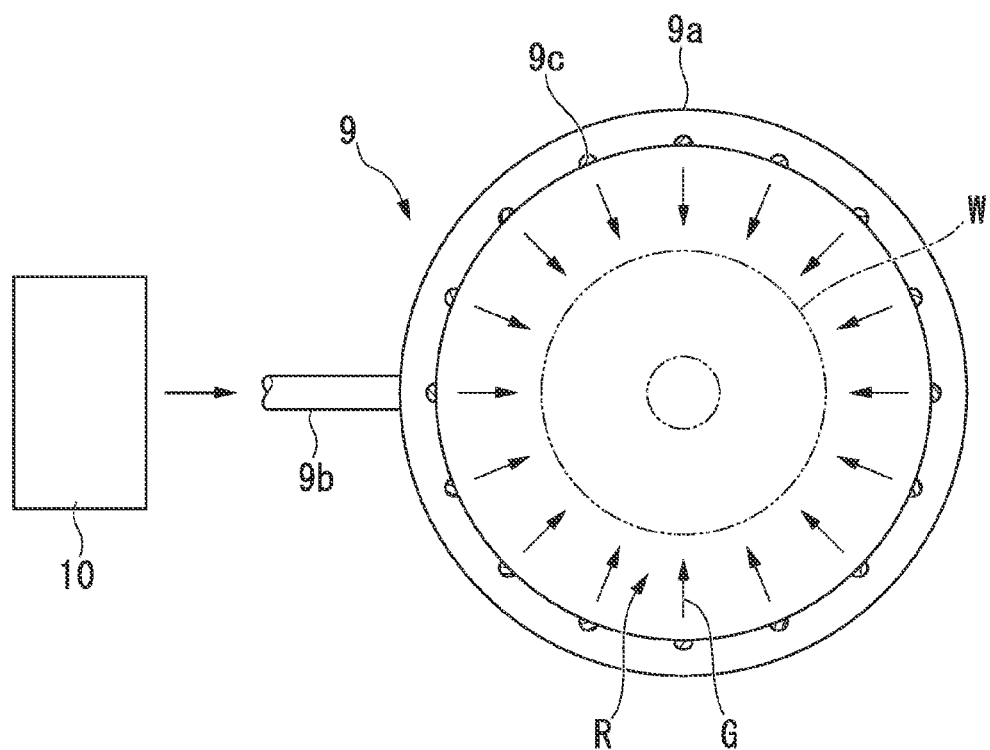
FIG. 3 is a plan view of a gas inflow pipe included in the processing device illustrated in FIG. 1.

The processing device 1, as illustrated in FIGS. 1 and 3, includes a gas inflow pipe (gas inflow means) 9 that introduces gas into the inside of the reaction vessel 2. This gas inflow pipe 9 includes an annular portion 9a that is formed in a ring shape in correspondence with the processing target substrate W having a disc shape and is connected to a gas-supplying source 10 through a connection portion 9b connected to the annular portion 9a. In addition, the annular portion 9a of the gas inflow pipe 9 is arranged so as to surround the periphery of a reaction space R that is formed between the processing target substrate W and the target T. Furthermore, in the inner circumferential portion of this annular portion 9a, a plurality of gas-discharging openings 9c is disposed so as to be aligned in the circumferential direction, and accordingly, the gas inflow pipe 9 can discharge the gas G, which is supplied from the gas-supplying source 10, from the plurality of gas-discharging openings 9c toward the processing target substrate W located on the inner side thereof.

In addition, regarding the diameters of the gas-discharging openings 9c, it is preferable that the diameters of the gas-discharging openings 9c be configured to be changed so as to allow the amount of gas G discharged from each gas discharging opening 9c to be constant. More specifically, it is preferable that the diameter of the gas discharging opening 9c be increased in accordance with the distance from the connection portion 9b such that the amount of gas G discharged from each gas-discharging openings 9c is constant.

Furthermore, in the pipe arrangement between the gas inflow pipe 9 and the gas-supplying source 10, an adjustment valve not illustrated in the figure is disposed. In the processing device 1, the adjustment valve can be controlled to be open or closed, and the flow rate of gas G that is supplied to the gas inflow pipe 9 through this adjustment valve can be adjusted.

On a face (rear face) of each backing plate 8 that is opposite to the target T, a magnet (magnetic field-generating means) 11 that generates a magnetic field is arranged. Each magnet 11 is installed to the rotation shaft 12a of a driving motor 12 and is driven to rotate within a plane parallel to the backing plate 8 by the driving motor 12.

In the front-side partition wall 6a and the rear-side partition wall 6b of the reaction vessel 2, opening portions 13 that face the inside of the reaction vessel 2 are disposed. These opening portions 13 are formed in an oval shape (racetrack shape) having a size sufficient for arranging the processing unit 1A that includes the backing plate 8 to which the above-described target T is installed, the gas inflow pipe 9, and the driving motor 12 to which the magnet 11 is installed at positions facing both faces of two processing target substrates W held by the holder 3. In addition, cylinder-shaped housings 14 that seal the peripheries of the opening portions 13 to be air-tight are installed to the front-side partition wall 6a and the rear-side partition wall 6b, and the driving motor 12 is fixedly supported by the inner side of the housing 14. Furthermore, in order to open the reaction vessel 2 at the time of maintenance and the like, the front-side partition wall 6a and the rear-side partition wall 6b are installed to the reaction vessel 2 so as to be freely opened or closed.

The processing device 1, as illustrated in FIG. 1, includes, as decompressing and exhausting means that decompresses and exhausts the inside of the reaction vessel 2, first vacuum pumps 15 that are arranged on the upper side of the reaction vessel 2 and a second vacuum pump 16 that is arranged on the lower side of the reaction vessel 2.

The first vacuum pump 15 is a turbo molecular pump that is installed through an upper pump chamber 17A that is arranged on the upper side of the reaction vessel 2. Since a configuration is employed in which lubricating oil is not used, the turbo molecular pump has a high degree of cleanliness (cleanness factor) and a high exhaust speed, whereby a high degree of vacuum is acquired. In addition, the turbo molecular pump is appropriate for exhausting gas having high reactivity.

The upper pump chamber 17A is configured to be air-tight by partition walls having pressure resistance and is installed to the upper portion of the reaction vessel 2 so as to form an internal space 7A that is continuous from the internal space 7 of the reaction vessel 2. In addition, the first vacuum pumps 15 are installed to both side faces of the upper pump chamber 17A in the state of facing each other.

On the other hand, the second vacuum pump 16 is a cryopump that is installed through a lower pump chamber 17B that is arranged on the lower side of the reaction vessel 2. The cryopump forms an extremely low temperature and can attain a high degree of vacuum by performing condensation or low-temperature adsorption of internal gas, and, especially, has a superior exhaust speed and a high degree of cleanliness to the turbo molecular pump.

The lower pump chamber 17B is configured to be air-tight by partition walls having pressure resistance and communicates with the internal space 7 of the reaction vessel 2 through a hole portion 6d that is formed in a bottom wall 6c of the reaction vessel 2. The second vacuum pump 16 is connected to the side face of the lower pump chamber 17B.

The processing device 1 can decompress the inside of the reaction vessel 2 or exhaust gas introduced into the inside of the reaction vessel 2 while controlling the driving of the first vacuum pump 15 and the second vacuum pump 16.

In addition, in this embodiment, although a configuration is employed in which two of the first vacuum pumps 15 are arranged on both side faces of the reaction vessel 2, and one of the second vacuum pump 16 is arranged on the lower side of the reaction vessel 2, the arrangement and the numbers of the vacuum pumps 15 and 16 may be appropriately changed. For example, while the time required for decompressing and exhausting the inside of the reaction vessel 2 decreases as the number of the vacuum pumps 15 and 16 is increased, in a case where the number of the first and second vacuum pumps 15 and 16 is increased too much, the size of the processing device 1 is increased, and the power consumption is increased, and accordingly, it is preferable to determine the numbers of the first and second vacuum pumps 15 and 16 from this viewpoint.

In addition, maintenance for the cryopump used in the above-described second vacuum pump 16 needs to be performed for every predetermined period due to an internal saving structure, different from the turbo molecular pump having an externally discharging structure. In addition, in a case where the gas introduced into the inside of the reaction vessel 2 is gas having high reactivity, it is preferable to exhaust the gas to the outside of the reaction vessel 2 by using the first vacuum pump 15 that is formed from the above-described turbo molecular pump. Accordingly, while corrosion of metal components such as bearings 28 and 30 configuring the conveying device 5 due to the flow of gas after the reaction into the lower side of the reaction space 7 is prevented, the inside of the reaction vessel 2 can be maintained to be clean. In addition, as the above-described second vacuum pump 16, instead of the cryopump, a turbo molecular pump can be used.

Figure 4:
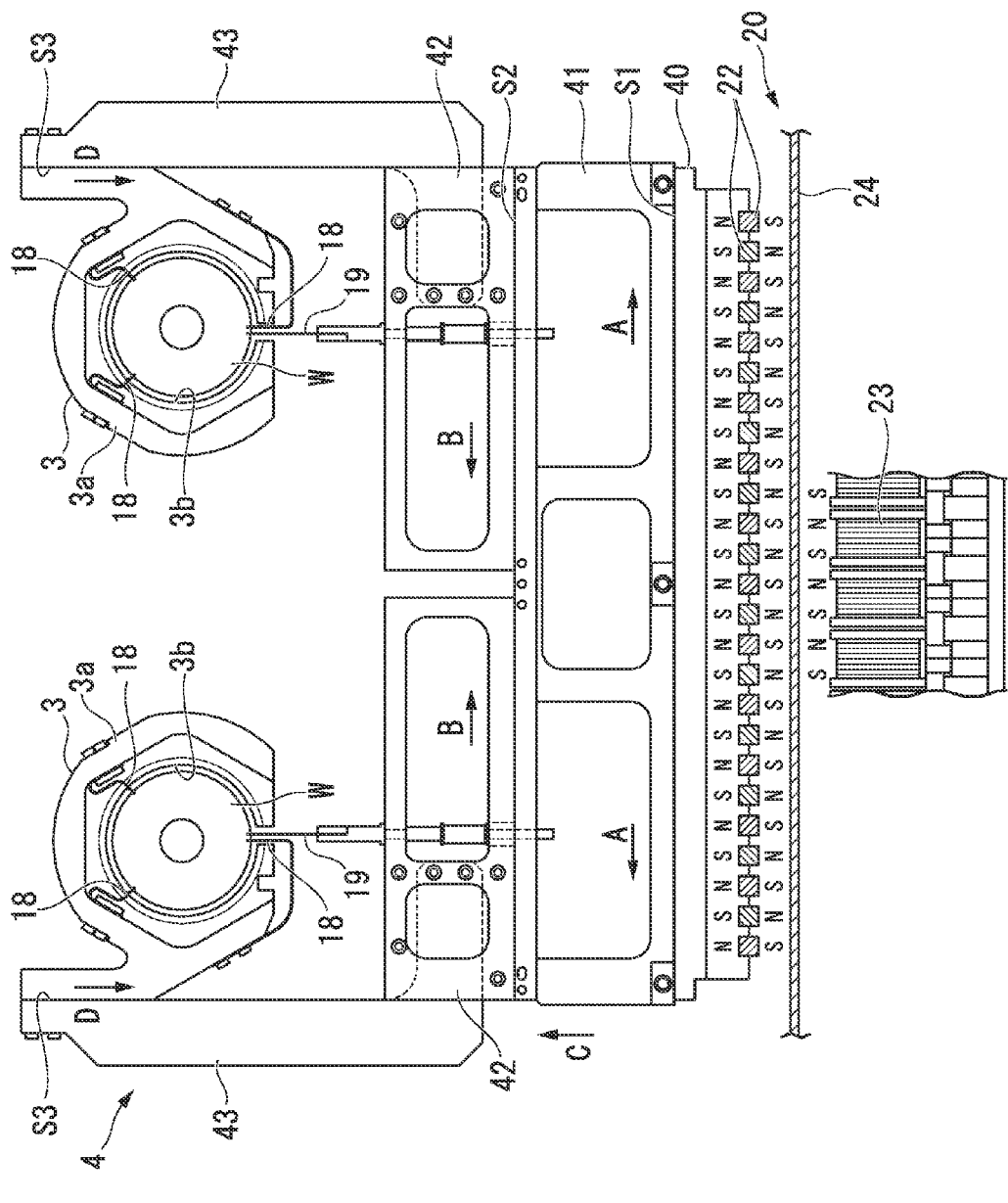
FIG. 4 is a side view of a carrier and a conveying device included in the processing device illustrated in FIG. 1, viewed in a direction perpendicular to the conveying direction.

The carrier 4, as illustrated in FIG. 4, includes a support base 40, a first supporting member 41 that is installed to the support base 40, two second supporting members 42 installed to the first supporting member 41, and two third supporting members 43 installed to the second supporting members 42 and has a structure in which holders 3 are installed to the third supporting members 43.

Among these, the support base 40, for example, is formed from a long member made of an aluminum alloy, and a permanent magnet 22, which configures a driving device 20, to be described later, can be arranged on the lower face of the support base 40.

On the other hand, the first supporting member 41, for example, is formed from a member made of an aluminum alloy, is formed in a frame shape for weight reduction, and is installed to a flattened upper face (attaching face S1) of the support base 40 through screw clamping. In addition, the first supporting member 41 is supported so as to be displaceable in the horizontal direction along the attaching face S1 of the support base 40 in accordance with the growth in the horizontal direction due to thermal expansion.

On the other hand, the second supporting member 42, for example, is formed from a member made of an aluminum alloy, is formed in a frame shape for weight reduction, and is installed to a flattened upper face (attaching face S2) of the first supporting member 41. In addition, the second supporting member 42 is supported so as to be displaceable in the horizontal direction along the attaching face S2 of the first supporting member 41 in accordance with the growth in the horizontal direction due to thermal expansion.

Here, the first supporting member 41 that is installed to the support base 40 is displaced (grown) in the horizontal direction together with the support base 40 due to thermal expansion. In other words, as denoted by arrows A illustrated in FIG. 4, in a case where the center of the support base 40 is used as a reference, the first supporting member 41 is displaced (grown) toward both ends thereof.

In order to negate the above-described growth of the first supporting member 41 in the horizontal direction, which occurs due to thermal expansion, as denoted by arrows B illustrated in FIG. 4, the two second supporting members 42 are installed so as to be displaceable from both ends of the first supporting member 41 toward the center. In other words, the two second supporting members 42 are installed to the upper face (attaching face S2) of the first supporting members 41 in a state in which end portions located on the outer sides are positioned through screw clamping. Accordingly, each second supporting member 42, in accordance with the growth in the horizontal direction, which occurs due to thermal expansion, can be displaced from the outer side of the attaching face S2 toward the inner side, that is, from both ends of the first supporting member 41 toward the center.

The third supporting members 43 are formed from a material having a coefficient of thermal expansion that is lower than those of the above-described first and second supporting members 41 and 42 and, in this embodiment, for example, ceramics are used. Two of the third supporting members 43 are formed in a long shape and are installed in a state of being vertically erected from both ends of the second supporting members 42.

The holders 3 are installed to the inner side faces (attaching faces S3) of the above-described third supporting members 43, which face each other, through screw clamping. In addition, the holders 3 are supported so as to be displaceable in the vertical direction along the attaching face S3 of the third supporting member 43 in accordance with the growth in the vertical direction which occurs due to thermal expansion.

Here, since the first supporting member 41 is installed to the upper face (attaching face S1) of the support base 40, and the second supporting members 42 are installed to the upper face (attaching face S2) of the first supporting member 41, the first and second supporting members 41 and 42, as denoted by arrow C illustrated in FIG. 4, are displaced (grown) due to thermal expansion in the vertically upward direction.

In addition, although the third supporting members 43 are also displaced (grown) due to thermal expansion in the vertically upward direction by being installed to the upper faces (attaching faces S3) of the second supporting members 42, the third supporting members 43 are formed from ceramics having a coefficient of thermal expansion that is lower than those of the above-described first and second supporting members 41 and 42 made from aluminum alloys, and accordingly, the growth can be suppressed.

In order to negate the growth of the above-described first and second supporting members 41 and 42, the holders 3 are installed so as to be displaceable in the vertically downward direction. In other words, the two holders 3 are installed to the side faces (attaching faces S3) of the third supporting members 43 in a state in which the upper end portions are positioned through screw clamping. Accordingly, the holders 3, as denoted by arrows D illustrated in FIG. 4, can be displaced in the vertically downward direction along the attaching faces S3 in accordance with the growth due to thermal expansion in the vertical direction.

In each holder 3, a circular hole portion 3b having a diameter slightly larger than the outer diameter of the processing target substrate W is formed in a board 3a having a thickness that is about one time to several times of the thickness of the processing target substrate W, and a configuration is formed in which the processing target substrate W is held on the inside of the hole portion 3b.

More specifically, on the periphery of the hole portion 3b of the holder 3, a plurality of supporting arms 18 that support the processing target substrate W is installed so as to be able to be elastically transformed. Three supporting arms 18 as the plurality of supporting arms 18 are aligned with a predetermined gap on the periphery of the hole portion 3b of the board 3a so as to support the outer peripheral portion of the processing target substrate W arranged inside the hole portion 3b at three points including a lower side supporting point that is located at the lowest point of the outer periphery and a pair of upper side supporting points located on the upper portion of the outer periphery which have symmetry with respect to a center line extending along the direction of the gravitational force passing the lower side supporting point.

Each supporting arm 18 is formed from a flat spring that is folded in the shape of "L", the base end side thereof is fixedly supported by the holder 3, and the tip end side is arranged in the state of being protruded toward the inside of the hole portion 3b. In addition, in the tip end portion of each supporting arm 18, although not illustrated in the figure, a groove portion with which the outer peripheral portion of the processing target substrate W is engaged is disposed.

Thus, the holder 3 can hold the processing target substrate W inserted into the inside of each supporting arm 18 so as to be freely detached or attached while bringing the outer peripheral portion of the processing target substrate W into contact with the three supporting arms 18. In addition, the attachment or the detachment of the processing target substrate W to or from the holder 3 can be performed by pressing down the supporting arm 18 located at the lower side supporting point.

In addition, in the carrier 4, an electrode terminal 19 is disposed which is used for applying a bias voltage to the processing target substrate W that is held by the holder 3. This electrode terminal 19 can be brought into contact with or separated from the outer peripheral portion of the processing target substrate W that is held by the holder 3 from the lower side by being supported so as to be movable in the vertical direction.

Figure 5:
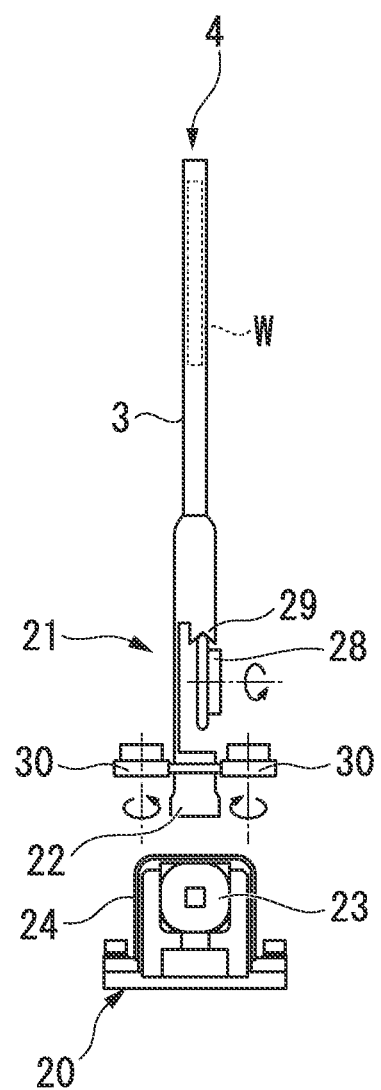
FIG. 5 is a side view of the carrier and the conveying device included in the processing device illustrated in FIG. 1, viewed in the conveying direction.

The conveying device 5, as illustrated in FIGS. 1, 4, and 5, includes a driving device 20 that drives the carrier 4 in a non-contact state and a guiding device 21 that guides the carrier 4 that is conveyed.

The driving device 20 includes a plurality of permanent magnets 22 that are arranged in the lower portion of the carrier 4 such that the N pole and the S pole are arranged so as to be alternately aligned and a plurality of electromagnets 23 that are arranged so as to face the plurality of permanent magnets 22 and be aligned in the conveying direction of the carrier 4 on the lower side thereof.

In order to secure a high-speed response according to the electromagnet 23, as the permanent magnet 22, it is preferable to use a magnet having strong attractive and repulsive forces for the electromagnet 23 such as a ferrite magnet or a rare-earth magnet. Among these, the ferrite magnet can be easily processed and has high toughness, and accordingly, it has an advantage of being easily maintained at a portion of the carrier 4 through screw clamping. On the other hand, although the rare-earth magnet is difficult to process and is brittle, it has a strong attractive force and a repulsive force for the electromagnet 23, and accordingly, the carrier 4 can be moved at higher speed. In addition, in a case where the rare-earth magnet is used, it is difficult to maintain the rare-earth magnet at a portion of the carrier 4 through screw clamping or the like, and accordingly, it is preferable to employ a structure in which the surface thereof is covered with a nonmagnetic material such as stainless board, and the rare-earth magnet is embedded inside the carrier 4. In addition, as the permanent magnet 22, it is preferable to a use an SmCo-based or NdFeB-based sintered magnet owing to strong attractive and repulsive forces.

While the electromagnet 23 is acquired by winding an electric wire around a magnetic core in the shape of a coil, there are many cases where the magnetic core and the electric wire are not members that are used in a vacuum, and a resin or the like is used as the insulating coating of the electric wiring, and there are many cases where it is not preferable to use the insulating coating in a vacuum. Thus, in the present invention, the electromagnet 23 is arranged inside a space that is formed by a cover 24 having permeability in a state of being separated from the internal space 7 of the reaction vessel 2. Accordingly, the electromagnet 23 can be arranged so as to face the outer portion (the atmosphere side) of the reaction vessel 2.

Thus, according to this driving device 20, by supplying power to the electromagnet 23, the carrier 4 can be driven in a non-contact state while the electromagnet 23 and the permanent magnet 22 are magnetically coupled.

The guiding device 21 includes a plurality of main bearings 28 supported so as to be freely rotatable around the horizontal axis, the plurality of main bearings 28 guides the carrier 4 in the vertical direction and is disposed so as to be aligned on a straight line in the conveying direction of the carrier 4. On the other hand, the carrier 4 includes a guide rail 29 in which groove portions to be engaged with the plurality of main bearings 28 are formed.

In addition, the guiding device 21 includes a pair of sub bearings 30 that is supported so as to be freely rotatable around the vertical axis, and the pair of sub bearings 30 guides the carrier 4 in the horizontal direction and is arranged to face each other such that the carrier 4 is interposed therebetween. In addition, a plurality of the pairs of the sub bearings 30, similarly to the plurality of main bearings 28, is disposed so as to be aligned on a straight line in the conveying direction of the carrier 4.

Thus, this guiding device 21 guides the carrier 4 that moves above the plurality of main bearings 28 in the state in which the plurality of main bearings 28 is engaged with the groove portions of the guide rail 29 and interposes the carrier 4 between the a pair of sub bearings 30, whereby the carrier 4 is prevented from being tilted while moving.

In addition, in order to secure smooth mechanical rotation by decreasing the friction between mechanical components, the main bearings 28 and the sub bearings 30 are configured by rolling bearings. These rolling bearings, although not illustrated in the figure, are installed to a supporting shaft that is fixed to a frame disposed inside the reaction vessel 2 so as to be freely rotatable.

In the processing device 1 having the above-described structure, a high-frequency voltage is applied to the target T through the backing plates 8, gas introduced from the gas inflow pipe 9 is ionized, and ions present inside plasma are caused to collide with the surface of the target T while generating the plasma on the periphery (the reaction space R) of the target T, whereby a thin film can be formed by depositing target particles driven away from the target T on the processing target substrate W.

In the above-described processing device 1, the first supporting member 41 that is installed to the upper face (attaching face S1) of the support base 40 grows due to the above-described thermal expansion at the time of driving in the horizontal direction together with the support base 40, and, in a case where the center of the support base 40 is set as a reference, is displaced toward both ends thereof, that is, one side (in the direction of arrows A shown in FIG. 4) in the horizontal direction.

In contrast to this, two of the second supporting members 42a and 42b installed to the upper face (attaching face S2) of the first supporting member 41 are displaced to the other side (the direction of arrows B shown in FIG. 4) along the attaching face S2 of the first supporting member 41 due to the thermal expansion at the time of driving, in other words, the second supporting members 42a and 42b are displaced from both ends of the first supporting member 41 toward the center so as to negate the growth of the above-described first supporting member 41 due to thermal expansion.

Here, in a case where the first supporting member 41 and the second supporting member 42 are formed from the same material, and the temperatures of both supporting members 41 and 42 are the same, the displacement of the third supporting member 43 in the horizontal direction still depends on the growth of the first supporting member 41 in the direction A of the first supporting member 41.

However, in the above-described carrier 4, the closer to the processing target substrate W a portion is, the higher the temperature of the portion is. In other words, inside the carrier 4 heated by plasma generated in the target T, the temperature of the processing target substrate W is the highest. Accordingly, in a case where the first supporting member 41 and the second supporting member 42 are formed from the same material, the temperature of the second supporting member 42 that is located close to the processing target substrate W is higher than that of the first supporting member 41.

Particularly, since the above-described carrier 4 has a structure acquired by combining the first supporting member 41, the second supporting members 42, the third supporting members 43, and the holder 3 together, the heat transfer between members is restricted so as to form a structure in which a difference in the temperatures of the members can easily occur.

Accordingly, regarding the first supporting member 41 and the second supporting members 42, the amount of the displacement of the second supporting member 42 per unit length due to thermal expansion is larger than that of the first supporting member 41. In other words, in the carrier 4 illustrated in FIG. 4, the amount of displacement of the second supporting member 42 in the direction B is larger than that of the first supporting member 41 in the direction A.

Accordingly, the horizontal displacements (growth) of the first supporting member 41 growing in the direction A and the second supporting members 42 growing in the direction B due to thermal expansion can be cancelled with each other, and, as a result, the positional deviation of the processing target substrate W held by the holder 3 in the horizontal direction can be suppressed.

In addition, in the above-described processing device 1, due to the above-described thermal expansion at the time of driving, while the first, second, and third supporting members 41, 42, and 43 are displaced in the vertically upward direction (the direction of arrow C shown in FIG. 4), the holder 3 is displaced in the vertically downward direction (the direction of arrows D shown in FIG. 4) along the side face (attaching face S3) of the third supporting member 43 so as to negate the growth of the supporting members 41, 42, and 43 due to thermal expansion in the vertical direction.

Here, in the above-described carrier 4, the temperature rises in the order of closeness to the processing target substrate W, in other words, in the order of the holder 3, the third supporting member 43, the second supporting member 42, and the first supporting member 41. Accordingly, the amount of displacement of the members due to thermal expansion per unit length in the vertical direction increases in the order of the holder 3, the third supporting member 43, the second supporting member 42, and the first supporting member 41.

Accordingly, by using a material having a coefficient of thermal expansion which is lower than those of the first supporting member 41, the second supporting member 42, and the holder 3, for the third supporting members 43 that have the largest influence on the displacement in the vertical direction, the displacements (growth) of the first, second, and third supporting members 41, 42, and 43 growing in the direction C and the holder 3 growing in the direction D due to thermal expansion in the vertical direction can be cancelled out with each other, and, as a result, the positional deviation of the processing target substrate W held in the holder 3 in the vertical direction can be suppressed.

As above, according to the present invention, the deformation of the carrier 4 due to thermal expansion at the time of driving is prospected, and the positional deviation of the processing target substrate W held by the holder 3 can be suppressed without adjusting the handling position. Accordingly, in an in-line type film-forming apparatus including such a carrier 4, the dropping-out of the processing target substrate W from the holder 3 at the time of removing the processing target substrate W from the holder 3 can be prevented in advance.

In addition, according to the present invention, by decreasing the weight of the carrier 4, the conveying speed of the carrier 4 can be increased. Accordingly, in manufacturing a magnetic recording medium using the in-line type film-forming apparatus, by increasing the conveying speed of the carrier 4, the production capacity can be further improved.

Furthermore, the present invention is not necessarily limited to the above-described embodiments, and various changes can be made therein in the range not departing from the concept of the present invention.

Figure 6:
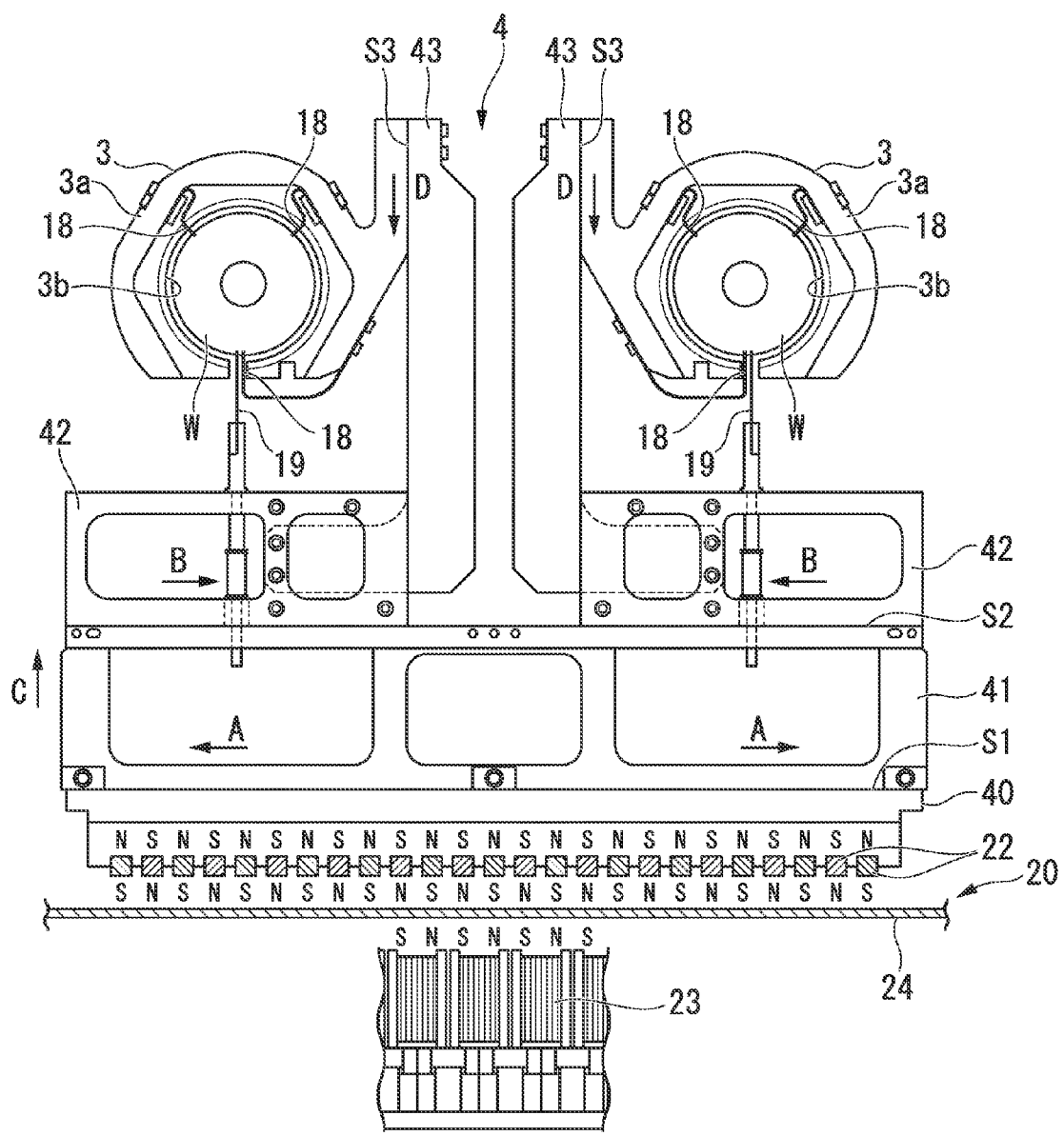
FIG. 6 is a side view illustrating a modified example of the carrier.

For example, in the above-described carrier 4, as illustrated in FIG. 4 described above, although a configuration is employed in which two of the third supporting members 43 are installed to the outer sides of the second supporting members 42, for example, as illustrated in FIG. 6, a configuration may be employed in which two of the third supporting members 43 are installed to the inner sides of the second supporting members 42.

Figure 7:
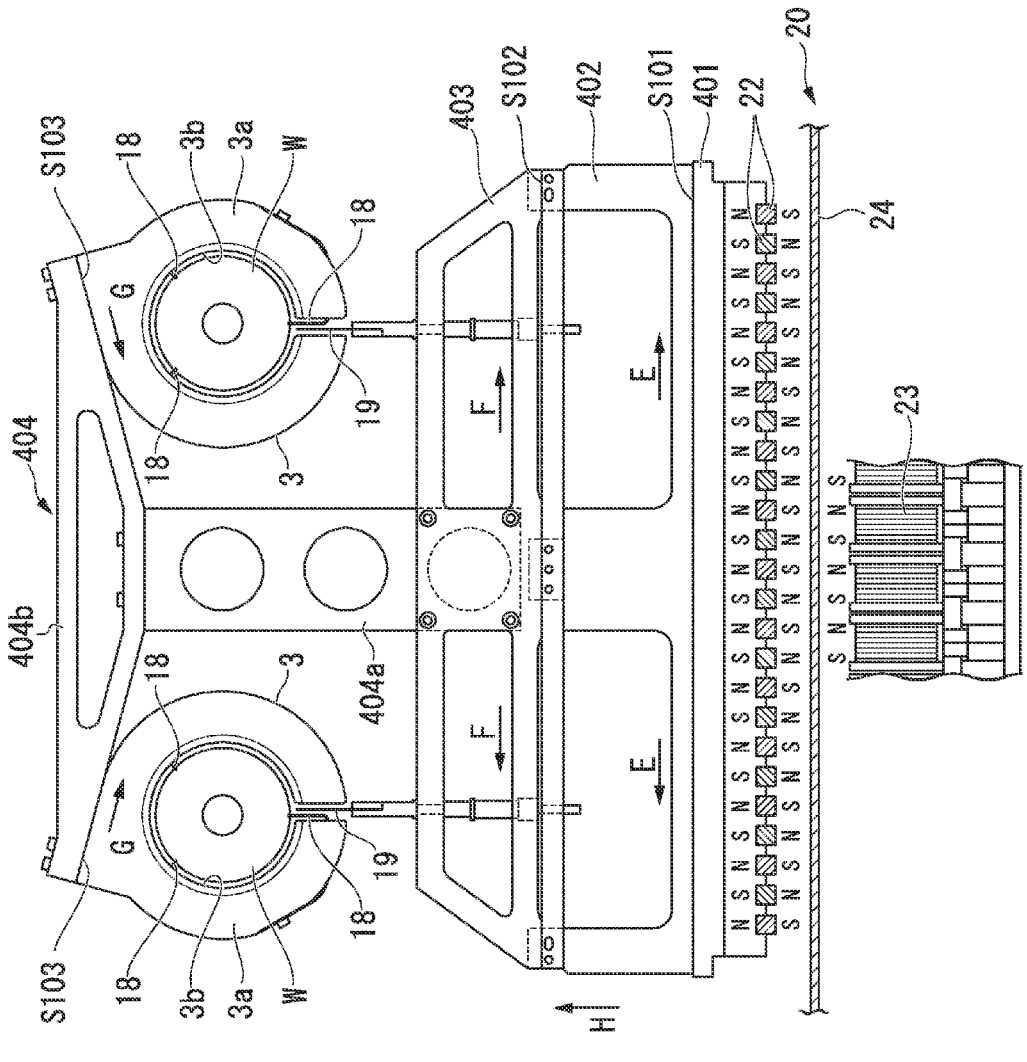
FIG. 7 is a side view illustrating another configuration example of the carrier.

In addition, instead of the above-described carrier 4, a carrier 400 illustrated in FIG. 7 can be used. More specifically, this carrier 400 includes a support base 401, a first supporting member 402 that is installed to the support base 401, a second supporting member 403 that is installed to the first supporting member 402, and a third supporting member 404 that is installed to the second supporting member 403, and has a structure in which a holder 3 is installed to the third supporting member 404.

Among these, the support base 401 is formed, for example, from a long member made of an aluminum alloy, and a permanent magnet 22 configuring the above-described driving device 20 can be arranged on the lower face of the support base 401.

On the other hand, the first supporting member 402 is formed by a member, for example, made from an aluminum alloy, is formed in the shape of a frame so as to decrease the weight, and is installed to the flattened upper face (attaching face S101) of the support base 401 through screw clamping. In addition, the first supporting member 402 is supported to be displaceable in the horizontal direction along the attaching face S101 of the support base 401 in accordance with the growth in the horizontal direction that is caused by thermal expansion.

Here, the first supporting member 402 installed to the support base 401 is displaced (grown) due to thermal expansion in the horizontal direction together with the support base 401. In other words, as denoted by arrows E shown in FIG. 7, in a case where the center of the support base 401 is set as a reference, the first supporting member 402 is displaced (grown) toward both ends thereof.

The second supporting member 403, for example, is formed from a member made of an aluminum alloy, is formed in the shape of a frame for decreasing the weight, and is installed to a flattened upper face (attaching face S102) of the first supporting member 402. In addition, the second supporting member 403 is supported so as to be displaceable in the horizontal direction along the attaching face S102 of the first supporting member 402 in accordance with the growth due to thermal expansion in the horizontal direction. More specifically, the second supporting member 403 is supported to be displaceable in the horizontal direction along the attaching face S102 of the first supporting member 402 in the state of being positioned in the center portion of the upper face of the first supporting member 402. Accordingly, the second supporting member 403, as denoted by arrows F in FIG. 7, can be displaced due to thermal expansion from the center of the first supporting member 402 toward both ends thereof.

The third supporting member 404 is configured by a main portion 404a and a beam portion 404b that are formed from a material having a coefficient of thermal expansion that is smaller than those of the above-described first and second supporting members 402 and 403, for example, ceramics. Of these, the main portion 404a is formed in a long shape and is installed in the state of being erected vertically from the center portion of the second supporting member 403. On the other hand, the beam portion 404b is formed in a long shape, and the center portion is installed in the horizontal state by matching the center portion thereof to a "T" shape in the upper end portion of the main portion 404a. In addition, in the main portion 404a and the beam portion 404b that configure the third supporting member 404, holes are formed so as to decrease the weight.

The holders 3 are located on both sides of the beam portion 404b with the main portion 404a of the above-described third supporting member 404 interposed therebetween and are installed to the lower face (attaching face S103) of the beam portion 404b through screw clamping. In addition, the holders 3 are supported to be displaceable along the attaching face S103 of the third supporting member 404 in accordance with the growth due to thermal expansion in the horizontal direction and the vertical direction.

Here, the lower faces (attaching faces S103) of the beam portion 404b that are located on both sides with the main portion 404a interposed therebetween are formed in directions intersecting the horizontal direction, more particularly, formed to rise upward from the center of the beam portion 404b toward both ends thereof in a tilted manner. Two holders 3 are installed to the lower faces (attaching faces S103) of the beam portion 404b in a state in which the upper end portions are positioned through screw clamping. Accordingly, each holder 3, as denoted by arrows G in FIG. 7, can be displaced from the outer side of the attaching face S103 toward the inner side thereof, in other words, from both ends of the beam portion 404b toward the center in the tilted downward direction in accordance with the growth due to thermal expansion in the horizontal direction and the vertical direction.

In addition, since the configurations of the holder 3, the supporting arm 18, and the electrode terminal 19 that are included in the above-described carrier 400 are almost the same as those of the carrier 4 illustrated in FIG. 4 described above, the description thereof will not be presented, and the same reference numerals are assigned thereto in the figure.

In the carrier 400 having the above-described structure, the first supporting member 402 that is installed to the upper face (attaching face S101) of the support base 401 grows due to the above-described thermal expansion at the time of driving in the horizontal direction together with the support base 401, and, in a case where the center of the support base 401 is set as a reference, is displaced toward both ends thereof, that is, one side (in the direction of arrows E shown in FIG. 7) in the horizontal direction. In addition, the second supporting member 403 that is installed to the upper face (attaching face S102) of the first supporting member 402 is also displaced due to thermal expansion at the time of driving to one side (the direction of arrows F shown in FIG. 7) in the horizontal direction along the attaching face S102 of the first supporting member 402, in other words, from the center of the first supporting member 402 toward both ends thereof.

In contrast to this, two holders 3 installed to the lower face (attaching face S103) of the above-described beam portion 404b are displaced due to thermal expansion at the time of driving to the other side (the horizontal direction in the direction of arrows G shown in FIG. 7) in the horizontal direction along the attaching face S103 of the beam portion 404b, in other words, are displaced from both ends of the beam portion 404b toward the center in the tilted downward direction so as to negate the growth due to thermal expansion of the first and second supporting members 402 and 403 in the horizontal direction.

Here, in the above-described carrier 400, the temperature rises in the order of closeness to the processing target substrate W, in other words, in the order of the holder 3, the third supporting member 404, the second supporting member 403, and the first supporting member 402.

Accordingly, the amount of displacement of the members due to thermal expansion per unit length in the horizontal direction increases in the order of the holder 3, the third supporting member 404, the second supporting member 403, and the first supporting member 402.

Accordingly, by using a material having a coefficient of thermal expansion which is lower than those of the first supporting member 402, the second supporting members 403, and the holder 3, for the third supporting members 404 that have the largest influence on the displacement in the vertical direction, the displacements (growth) of the first and second supporting members 402 and 403 growing in the directions E and F and the holder 3 growing in the direction G due to thermal expansion in the vertical direction can be cancelled out with each other, and, as a result, the positional deviation of the processing target substrate W held in the holder 3 in the horizontal direction can be suppressed.

In addition, since the first supporting member 402 is installed to the upper face (attaching face S101) of the support base 401, and the second supporting member 403 is installed to the upper face (attaching face S102) of the first supporting member 402, the first and second supporting members 402 and 403, as denoted by arrow H in FIG. 7, are displaced (grown) vertically upwardly due to thermal expansion.

In contrast to this, two holders 3 are displaced due to thermal expansion at the time of driving in the downward side (a vertical component in the direction denoted by arrow G shown in FIG. 7) along the attaching face S103 of the beam portion 404b, in other words, are displaced from both ends of the beam portion 404b toward the center in the tilted downward direction so as to negate the growth of the above-described first and second supporting members 402 and 403 due to thermal expansion in the vertical direction.

Accordingly, the displacements (growth) of the first and second supporting members 402 and 403 growing in the direction H and the holder 3 growing in the direction G due to thermal expansion in the vertical direction can be cancelled out with each other, and, as a result, the positional deviation of the processing target substrate W held in the holder 3 in the vertical direction can be suppressed.

In addition, while the third supporting member 404, due to its installation to the upper face of the second supporting member 403, is vertically upwardly displaced (grown) due to thermal expansion, the third supporting member 404 is formed from ceramics having a coefficient of thermal expansion that is smaller than those of the above-described first and second supporting members 402 and 403 made from an aluminum alloy, and accordingly, the growth can be suppressed.

As above, according to the present invention, the deformation of the carrier 400 due to thermal expansion at the time of driving is prospected, and the positional deviation of the processing target substrate W held by the holder 3 can be suppressed without adjusting the handling position. Accordingly, in an in-line type film-forming apparatus including such a carrier 400, the dropping-out of the processing target substrate W from the holder 3 at the time of removing the processing target substrate W from the holder 3 can be prevented in advance.

In addition, according to the present invention, by decreasing the weight of the carrier 400, the conveying speed of the carrier 400 can be increased. Accordingly, in manufacturing a magnetic recording medium using the in-line type film-forming apparatus, by increasing the conveying speed of the carrier 400, the production capacity can be further improved.

(In-Line Type Film-forming Apparatus)

Figure 8:
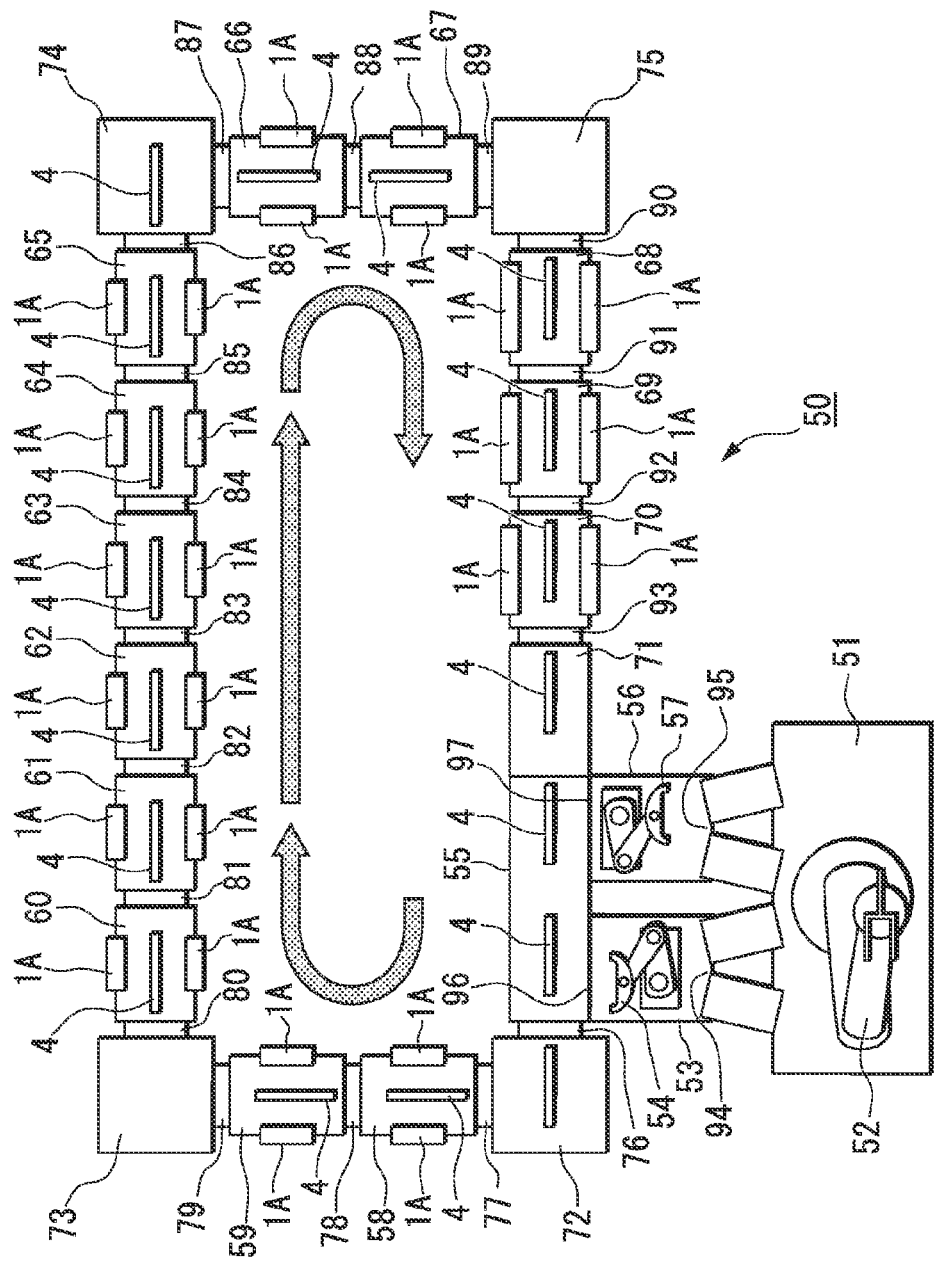
FIG. 8 is a configuration diagram illustrating an example of an in-line type film-forming apparatus according to the present invention.

Next, the configuration of an in-line type film-forming apparatus 50 according to the present invention, which is illustrated in FIG. 8, will be described.

This in-line type film-forming apparatus 50, as illustrated in FIG. 8, is schematically configured so as to include: a substrate-conveying robot chamber 51; a substrate conveying robot 52 installed on the substrate-conveying robot chamber 51; a substrate-installing robot chamber 53 that is adjacent to the substrate-conveying robot chamber 51; a substrate-installing robot 54 that is arranged inside the substrate-installing robot chamber 53; a substrate-exchanging chamber 55 that is adjacent to the substrate-installing robot chamber 53; a substrate-removing robot chamber 56 that is adjacent to the substrate-exchanging chamber 55; a substrate-removing robot 57 that is arranged inside the substrate-removing robot chamber 56; a plurality of processing chambers 58 to 70 and a preliminary chamber 71 that are arranged so as to be aligned between the input side and the output side of the substrate-exchanging chamber 55; a plurality of corner chambers 72 to 75; and a plurality of the above-described carriers 4 that are sequentially conveyed between the chambers 58 to 71 reaching from the input side to the output side of the substrate-exchanging chamber 55 and the corner chambers 72 to 75.

In addition, between the chambers reaching from the input side to the output side of the substrate-exchanging chamber 55, gate valves 76 to 93 that can be freely open or closed are disposed. By causing the gate valves 76 to 93 to be in closed states, the chambers 58 to 71 can respectively form independent closed spaces.

The substrate-conveying robot 52 is used for supplying a processing target substrate W from a cassette (not illustrated in the figure) in which non-processed substrates W before film formation are housed to the substrate-installing robot chamber 54 and collecting the processing target substrate W after film formation from the substrate-removing robot chamber 56. In addition, between the substrate-conveying robot chamber 51 and the substrate-installing and substrate-removing robot chambers 53 and 56, gate units 94 and 95 that can be freely open or closed are disposed. Furthermore, also between the substrate-exchanging chamber 55 and the substrate-installing and substrate-removing robot chambers 53 and 56, gate units 96 and 97 that can be freely open or closed are disposed.

The substrate-installing robot 54 installs a processing target substrate W before film formation to the carrier 4 disposed inside the substrate-exchanging chamber 55, and the substrate-removing robot 57 removes a processing target substrate W after film formation from the carrier 4 disposed inside the substrate-exchanging chamber 55.

Basically, the plurality of processing chambers 58 to 70 and the preliminary chamber 71 have the same configuration as that of the reaction vessel 2 of the above-described processing device 1, and on both side faces of each one of the processing chambers 58 to 70, processing units 1A corresponding to the processing content for the processing target substrate W maintained in the carrier 4 are arranged. In addition, the above-described vacuum pump, which is not illustrated in the figure, is connected to each one of the chambers 58 to 71, and through the operation of the vacuum pump, the chambers 58 to 71 can be individually decompressed or exhausted. In addition, a rotation device (not illustrated in the figure) used for changing the moving direction of the carrier 4 is disposed in each one of the corner chambers 72 to 75.

In this in-line type film-forming apparatus 50, while a plurality of the carriers 4 is sequentially conveyed between the chambers 58 to 71 reaching from the input side to the output side of the substrate-exchanging chamber 55 and the corner chambers 72 to 75, a film-forming process and the like can be performed for the processing target substrate W (not illustrated in FIG. 8) that is maintained in each carrier 4.

Figure 9:
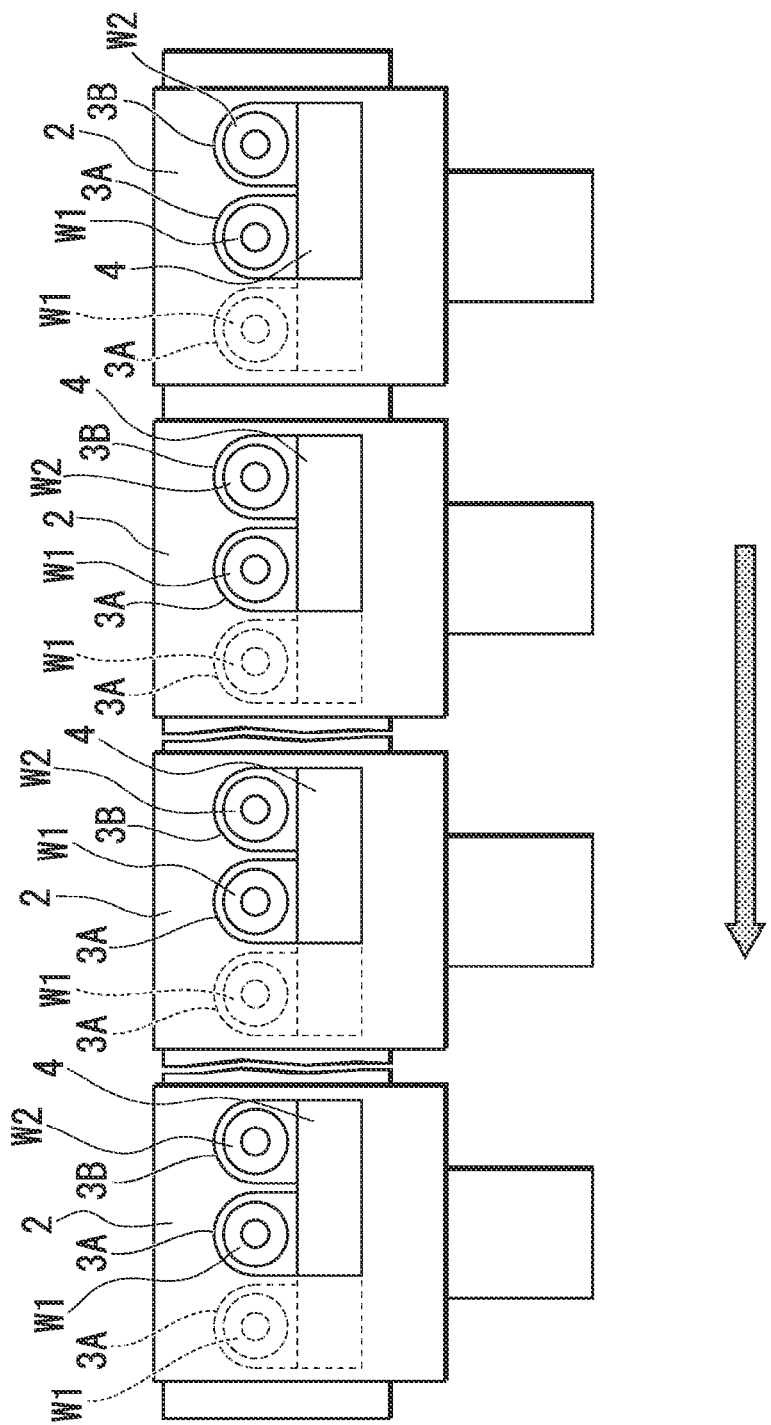
FIG. 9 is a side view illustrating a case where two processing substrates are alternately processed by the in-line type film-forming apparatus illustrated in FIG. 8.

In addition, in this embodiment, although two processing target substrates W held by the holder 3 of the carrier 4 can be simultaneously processed, in a case where a configuration is employed in which only a processing target substrate W held by one holder 3 is processed, for example, as denoted by solid lines in FIG. 9, the processing target substrate W1 held by one holder 3A of the carrier 4 is processed, and then, as denoted by broken lines shown in FIG. 9, the position of the carrier 4 is shifted inside the reaction vessel 2, and the processing target substrate W2 held by the other holder 3B (denoted by broken lines in FIG. 8) of the carrier 4 is processed. Accordingly, two processing target substrates W1 and W2 held by the holders 3 of the carrier 4 can be alternately processed.

Furthermore, in the in-line type film-forming apparatus 50 according to the present invention, the carrier 4 can be conveyed at high speed by the above-described conveying device 5, and accordingly, in a case where a magnetic recording medium is manufactured by using this in-line type film-forming apparatus 50, the operating ratio is increased, whereby the productivity of the recording medium can be increased.

(Method of Manufacturing Magnetic Recording Medium)

Next, a method of manufacturing a magnetic recording medium according to the present invention will be described.

In the method of manufacturing a magnetic recording medium according to the present invention, while nonmagnetic substrates that are processing target substrates W maintained in the carrier 4 are sequentially conveyed between the plurality of processing chambers 58 to 70, a magnetic layer configured by a soft magnetic layer, an intermediate layer, and a recording magnetic layer and a protection layer are sequentially laminated on both faces of each nonmagnetic substrate, by using the above-described in-line type film-forming apparatus 50. In addition, after the above-described in-line type film-forming apparatus 50 is used, by using a coating device not illustrated in the figure, a lubricating film is formed on the outermost surface of the processing target substrate W after film formation, whereby a magnetic recording medium is manufactured.

In the method of manufacturing a magnetic recording medium according to the present invention, by using the above-described in-line type film-forming apparatus 50, the production capacity of the magnetic recording medium can be increased, and a high-quality magnetic recording medium can be manufactured.

(Magnetic Recording Medium)

Figure 10:
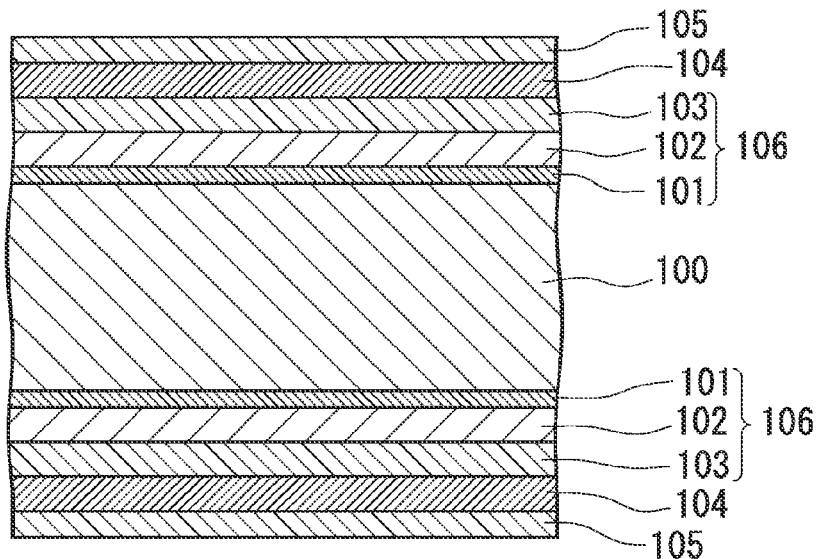
FIG. 10 is a cross-sectional view illustrating an example of a magnetic recording medium that is manufactured by applying the present invention.

Specifically, the magnetic recording medium that is manufactured by using the above-described in-line type film-forming apparatus 50, for example, as illustrated in FIG. 10, has a structure in which a soft magnetic layer 101, an intermediate layer 102, a recording magnetic layer 103, and a protection layer 104 are sequentially laminated on both faces of a nonmagnetic substrate 100 that is the above-described processing target substrate W and has a structure in which a lubricating film 105 is formed further on the outermost surface. In addition, a magnetic layer 106 is configured by the soft magnetic layer 81, the intermediate layer 82, and the recording magnetic layer 83.

As examples of the nonmagnetic substrate 100, there are various substrates such as an Al-alloy substrate that contains Al as its main component such as an Al—Mg alloy, a glass substrate made of soda glass, aluminosilicate-based glass, crystalline glass, or the like, a silicon substrate, a titanium substrate, a ceramic substrate, and a resin substrate, and, among them, it is preferable to use the Al-alloy substrate, a glass substrate, or a silicon substrate. In addition, the average surface roughness (Ra) of the nonmagnetic substrate 100 is preferably equal to or less than 1 nm, is more preferably equal to or less than 0.5 nm, and is further more preferably equal to or less than 0.1 nm.

While a magnetic layer 106 can be largely divided into a horizontal magnetic layer used for an in-plane magnetic recording medium and a vertical magnetic layer used for a vertical magnetic recording medium, in order to realize a higher recording density, the vertical magnetic layer is preferably used. In addition, as the magnetic layer 106, a Co alloy containing Co as its main component is preferably used. More specifically, in the case of the vertical magnetic layer, for example, a magnetic layer acquired by laminating a soft magnetic layer 101 formed from a soft magnetic FeCo alloy (FeCoB, FeCoSiB, FeCoZr, FeCoZrB, FeCoZrBCu, or the like), a FeTa alloy (FeTaN, FeTaC, or the like), a Co alloy (CoTaZr, CoZrNB, CoB, or the like), or the like, an intermediate layer 102 formed from Ru or the like, and a recording magnetic layer 103 formed from a 60 Co-15Cr-15 Pt alloy or a 70 Co-5Cr-15Pt-10 SiO$_2$ alloy or the like can be used. In addition, an orientation control film that is formed from Pt, Pd, NiCr, NiFeCr, or the like may be interposed between the soft magnetic layer 81 and the intermediate layer 82. On the other hand, in the case of the horizontal magnetic layer, for example, a magnetic layer that is acquired by laminating a nonmagnetic CrMo base layer and a ferromagnetic CoCrPtTa magnetic layer or the like can be used.

In addition, the magnetic layer 106 needs to be formed to have a thickness for which sufficient output-input characteristics of a magnetic head can be acquired in accordance with the types of used magnetic alloys and the lamination structure. On the other hand, in order to acquire an output of a predetermined level or higher at the time of reproduction, although the magnetic layer 106 needs to have a thickness to some degree, parameters representing the recording and reproducing characteristics are generally degraded in accordance with an increase in the output, and, accordingly, it is necessary to set an optimal thickness in consideration of such situations. More specifically, the whole thickness of the magnetic layer 106 is preferably equal to or more than 3 nm and equal to or less than 20 nm, and is more preferably equal to or more than 5 nm and equal to or less than 15 nm.

As the material of the protection layer 104, a material that is commonly used in a magnetic recording medium may be used, and, as examples of such a material, there are a carbonaceous material such as carbon (C), hydrogenated carbon (HXC), carbon nitride (CN) amorphous carbon, or silicon carbide (SiC), SiO$_2$, Zr$_2$O$_3$, TiN, and the like. In addition, the protection layer 104 may be formed by stacking two or more layers. In a case where the thickness of the protection layer 104 exceeds 10 nm, the distance between the magnetic head and the magnetic layer 106 increases, accordingly, sufficient input-output characteristics cannot be acquired, and thus, the thickness is preferably less than 10 nm.

The lubricating film 105, for example, can be formed by coating the upper side of the protection layer 104 with a fluorine-based lubricant, a hydrocarbon-based lubricant, or a lubricant made from a mixture thereof or the like. Generally, the film thickness of the lubricating film 105 is about 1 to 4 nm.

Figure 11:
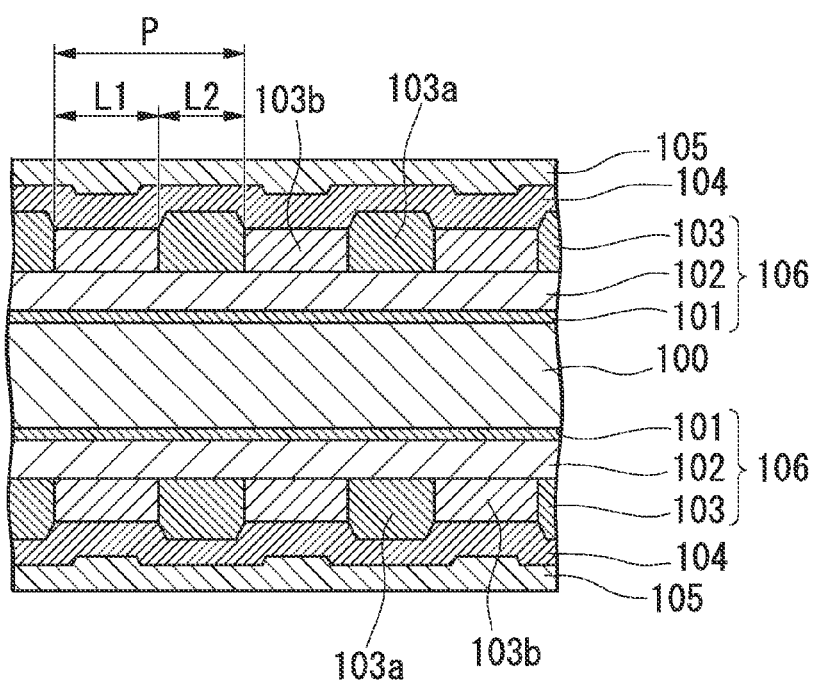
FIG. 11 is a cross-sectional view illustrating an example of a discrete-type magnetic recording medium that is manufactured by applying the present invention.

In addition, for the magnetic recording medium, a reactive plasma process or an ion irradiation treatment is performed for the recording magnetic layer 103 by using the above-described in-line type film-forming apparatus 50, and the magnetic characteristics of the recording magnetic layer 103 can be reformed. For example, the magnetic recording medium illustrated in FIG. 11 is a so-called discrete-type magnetic recording medium in which a magnetic recording pattern 103a formed in the recording magnetic layer 103 is separated by non-magnetization areas 103b.

As examples of the discrete-type magnetic recording medium, there are a patterned medium on which the magnetic recording pattern 103a is arranged so as to have a regularity for each one bit, a medium on which the magnetic recording pattern 103a is arranged in a track shape, a medium on which the magnetic recording pattern 103a includes a servo signal pattern and the like, and the like.

In addition, in the discrete-type magnetic recording medium, in order to increase the recording density, it is preferable that, in the recording magnetic layer 103, the width L1 of a portion that becomes a magnetic recording pattern 103a be equal to or less than 200 nm, and the width L2 of a portion that becomes a non-magnetization area 103b be equal to or less than 100 nm. In addition, the track pitch P (=L1+L2) of the magnetic recording medium is preferably equal to or less than 300 nm, and, in order to increase the recording density, it is preferable that the track pitch be configured to be as small as can be.

In the discrete-type magnetic recording medium, a mask layer is arranged on the surface of the recording magnetic layer 103, and portions not covered with the mask layer are exposed to a reactive plasma process, an ion irradiation process, or the like. Accordingly, the magnetic characteristics of a part of the recording magnetic layer 103 are reformed, and, preferably, the discrete-type magnetic recording medium can be acquired by forming a non-magnetization area 103b reformed from a magnetic body to a nonmagnetic body.

Here, the reformation of the magnetic characteristics of the recording magnetic layer 103 represents partially changing the coercive force, the residual magnetization, and the like of the recording magnetic layer 103 so as to pattern the recording magnetic layer 103, and the change represents that the coercive force is lowered so as to lower the residual magnetization.

More specifically, when the magnetic characteristics of the recording magnetic layer 103 are reformed, the amount of magnetization of the recording magnetic layer 103 disposed at the portions exposed to the reactive plasma or reactive ions is preferably equal to or less than 75% of the initial amount (not processed), and is more preferably equal to or less than 50% thereof, and the coercive force is preferably equal to or less than 50% of the initial force, and is more preferably equal to or less than 20%. Accordingly, the writing bleeding at the time of performing magnetic recording is prevented, whereby a high surface recording density can be acquired.

In addition, the reformation of the magnetic characteristics can be also realized by exposing the recording magnetic layer 103 that has been formed as a film to reactive plasma, reactive ions, or the like and forming portions (the non-magnetization area 103b) that separate the magnetic recording track or the servo signal pattern to be amorphous.

Here, the formation of the recording magnetic layer 103 to be amorphous represents the alteration of the crystal structure of the recording magnetic layer 103 and represents that the atomic arrangement of the recording magnetic layer 103 is formed to be in an irregular atomic arrangement state in which there is no long-distance order. More particularly, when the recording magnetic layer 103 is formed to be amorphous, the atomic arrangement of the recording magnetic layer 103 is preferably to be in a state in which fine crystal grains having a particle diameter less than 2 nm are randomly arranged. In addition, the atomic arrangement state of the recording magnetic layer 103 can be checked in accordance with an analysis method such as X-ray diffraction or electron beam diffraction as a state in which a peak representing a crystal plane is not allowed, and only halo is allowed.

(Magnetic Recording and Reproducing Device)

Figure 12:
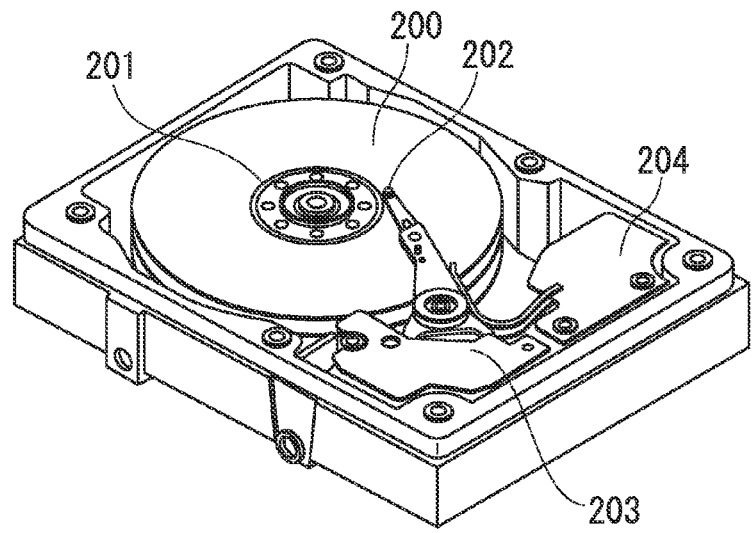
FIG. 12 is a perspective view illustrating a configuration example of a magnetic recording and reproducing device.
Figure 13:
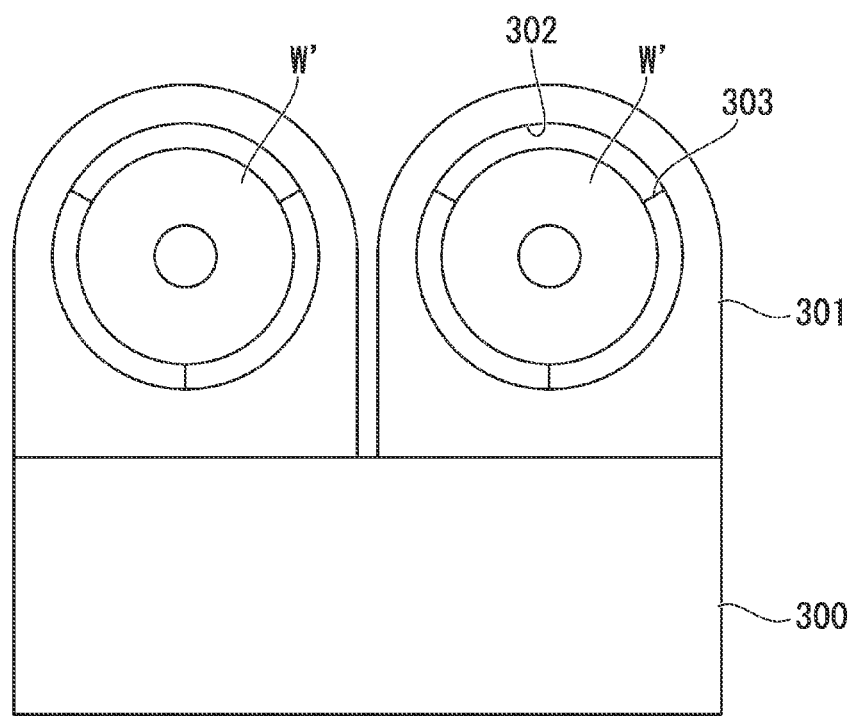
FIG. 13 is a side view of a carrier and a conveying device included in a conventional in-line type film-forming apparatus, viewed in a direction perpendicular to the conveying direction.

As a magnetic recording and reproducing device using the above-described magnetic recording medium, for example, there is a hard disk drive (HDD) as illustrated in FIG. 12. The magnetic recording and reproducing device includes: a magnetic disk 200 as the above-described magnetic recording medium; a medium-driving unit 201 that drives the magnetic disk 200 to rotate; a magnetic head 202 that performs a recording operation and a reproducing operation for the magnetic disk 201; a head-driving unit 203 that moves the magnetic head 202 in the diameter direction of the magnetic disk 200; and a signal-processing system 204 that is used for inputting a signal to the magnetic head 202 and reproducing an output signal transmitted from the magnetic head 202.

In such a magnetic recording and reproducing device, in a case where a magnetic recording medium of the above-described discrete track type is used as the magnetic disk 200, the writing bleeding at the time of performing magnetic recording for the magnetic disk 200 is prevented, and a high surface recording density can be acquired. In other words, by using the magnetic recording medium of the above-described discrete track type, a magnetic recording and reproducing device having a high recording density can be acquired.

In addition, in this magnetic recording and reproducing device, by processing the recording tracks to be magnetically discontinuous, instead of configuring the reproducing head width to be narrower than the recording head width so as to exclude the influence of a magnetization transition region of a track edge as in a conventional case, the operation can be performed while the reproducing head width and the recording head width are configured to be almost the same, whereby it is possible to acquire a sufficient reproduction output and a high SNR.

In addition, in this magnetic recording and reproducing device, by configuring the reproducing portion of the magnetic head 202 using a GMR head or a TMR head, a sufficient signal intensity can be acquired even at a high recording density. Furthermore, by floating the magnetic head 202 at a height lower than that of a general magnetic head, and, more particularly, by setting the amount of float of the magnetic head 202 in the range of 0.005 μm to 0.020 μm, a high SNR can be acquired by improving the output, and accordingly, a magnetic recording and reproducing device having a large capacity and high reliability can be configured.

In addition, by combining a signal processing circuit according to a maximum likelihood decoding method, the recording density can be further improved. For example, a sufficient SNR can be acquired even in a case where recording and reproducing are performed at a track density of 100 k track/inch or more, a linear recording density of 1000 k bits/inch or more, and a recording density of 100 G bits per square inch or more.

REFERENCE SIGNS LIST 1 processing device
1A processing unit
2 reaction vessel
2A gate valve
3 holder 3
4 carrier
5 conveying device
6a front-side partition wall
6b rear-side partition wall
6c bottom wall
6d hole portion
7 and 7A internal space
8 backing plate (cathode electrode)
9 gas inflow pipe (gas inflow means)
10 gas-supplying source
11 magnet (magnetic field-generating means)
12 driving motor
13 opening portion
14 housing
15 first vacuum pump (decompressing and exhausting means)
16 second vacuum pump (another decompressing and exhausting means)
17A upper pump chamber
17B lower pump chamber
18 supporting arm
19 electrode terminal
20 driving device
21 guiding device
22 permanent magnet
23 electromagnet
24 cover
28 main bearing
29 guide rail
30 sub bearing
31, 31A, and 31B shield plate
32, 32A, and 32B baking heater
W processing target substrate
T target
R reaction space
G gas
40 support base
41 first supporting member
42 second supporting member
43 third supporting member
50 in-line type film-forming apparatus
51 substrate-conveying robot chamber
52 substrate conveying robot
53 substrate-installing robot chamber
54 substrate-installing robot
55 substrate-exchanging chamber
56 substrate-removing robot chamber
57 substrate-removing robot
58 to 70 processing chamber
71 preliminary chamber
72 to 75 corner chamber
76 to 93 gate valve
94 to 97 gate unit
100 nonmagnetic substrate
101 soft magnetic layer
102 intermediate layer
103 recording magnetic layer
103a magnetic recording pattern
103b non-magnetization area
104 protection layer 105 lubricating film
106 magnetic layer
107 mask layer
108 resist layer
109 stamp
200 magnetic disk
201 medium-driving unit
202 magnetic head
203 head driving unit
204 signal-processing system
400 carrier
401 support base
402 first supporting member
403 second supporting member
404 third supporting member

The invention claimed is:

1. An in-line type film-forming apparatus comprising:
a plurality of chambers that perform a film-forming process;
a carrier in which a holder holding a substrate as a film-forming target inside the plurality of chambers is installed; and
a conveying device that sequentially conveys the carrier between the plurality of chambers,
wherein the carrier comprises a support base, a first supporting member that is installed to the support base, a second supporting member that is installed to the first supporting member, and a third supporting member that is installed to the second supporting member and has a structure in which the holder is installed to the third supporting member,
wherein the first supporting member is supported to be displaceable in a direction along an attaching face of the support base in accordance with growth of the first supporting member due to thermal expansion in a horizontal direction,
wherein the second supporting member is supported to be displaceable in a direction along an attaching face of the first supporting member in accordance with growth of the second supporting member due to thermal expansion in the horizontal direction,
wherein the holder is supported to be displaceable in a direction along an attaching face of the third supporting member in accordance with growth of the holder due to thermal expansion in a vertical direction, and
wherein, out of the first supporting member, the second supporting member, the third supporting member, and the holder, any one member is supported to be displaceable in a direction negating growth of the other members in the horizontal direction and/or the vertical direction.

2. The in-line type film-forming apparatus according to claim 1, wherein, in accordance with the growth of the second supporting member due to thermal expansion in the horizontal direction, the second supporting member is supported to be displaceable along an attaching face of the first supporting member in a direction negating the growth of the first supporting member due to thermal expansion in the horizontal direction.

3. The in-line type film-forming apparatus according to claim 1, wherein, in accordance with the growth of the holder due to thermal expansion in the horizontal direction, the holder is supported to be displaceable along an attaching face of the third supporting member in a direction negating the growth of the first and second supporting members due to thermal expansion in the horizontal direction.

4. The in-line type film-forming apparatus according to claim 1, wherein, in accordance with the growth of the holder due to thermal expansion in the vertical direction, the holder is supported to be displaceable along an attaching face of the third supporting member in a direction negating the growth of the first and second supporting members due to thermal expansion in the vertical direction.

5. The in-line type film-forming apparatus according to claim 1,
wherein a direction along an attaching face of the first supporting member for the support base and a direction along an attaching face of the second supporting member for the first supporting member are the horizontal direction, and
wherein a direction along an attaching face of the holder for the third supporting member is the vertical direction or a direction intersecting the horizontal direction.

6. The in-line type film-forming apparatus according to claim 1, wherein displacement of the second supporting member, which is due to thermal expansion, is larger than that of the first supporting member, and displacement of the holder, which is due to thermal expansion, is larger than that of the second supporting member.

7. The in-line type film-forming apparatus according to claim 1, wherein the third supporting member is formed from a material having a coefficient of thermal expansion that is smaller than those of the first and second supporting members.

8. The in-line type film-forming apparatus according to claim 1, wherein the holder comprises a hole portion used for arranging the substrate on the inside and a plurality of supporting arms installed to the periphery of the hole portion so as to be elastically transformable and holds the substrate inserted into the inside of the supporting arms so as to be freely detachable or attachable while an outer peripheral portion of the substrate is brought into contact with the plurality of the supporting arms.

9. The in-line type film-forming apparatus according to claim 8, wherein groove portions with which the outer peripheral portion of the substrate is engaged are disposed in tip end portions of the plurality of the supporting arms.

10. The in-line type film-forming apparatus according to claim 1, wherein the conveying device comprises a driving device that drives the carrier in a non-contact manner and a guiding device that guides the carrier driven by the driving device.

11. A method of manufacturing a magnetic recording medium, the method comprising:
forming at least a magnetic layer on the surface of the substrate by using the in-line type film-forming apparatus according to claim 1.

* * * * *